(12) United States Patent
Takeuchi et al.

(10) Patent No.: US 6,624,549 B2
(45) Date of Patent: Sep. 23, 2003

(54) PIEZOELECTRIC/ELECTROSTRICTIVE DEVICE AND METHOD OF FABRICATING THE SAME

(75) Inventors: Yukihisa Takeuchi, Nishikamo-Gun (JP); Tsutomu Nanataki, Toyoake (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 54 days.

(21) Appl. No.: 09/802,474

(22) Filed: Mar. 9, 2001

(65) Prior Publication Data

US 2002/0121843 A1 Sep. 5, 2002

(30) Foreign Application Priority Data

Mar. 2, 2001 (JP) ........................................ 2001-059281

(51) Int. Cl.[7] .............................................. H02N 41/08
(52) U.S. Cl. ...................................... 310/330; 310/328
(58) Field of Search ................................ 310/324, 328, 310/330, 331, 335, 348

(56) References Cited

U.S. PATENT DOCUMENTS

| | | | |
|---|---|---|---|
| 5,083,857 A | | 1/1992 | Hornbeck |
| 5,175,465 A | * | 12/1992 | Um et al. ................ 310/328 |
| 5,636,051 A | * | 6/1997 | Lim ........................... 310/328 |
| 5,760,947 A | * | 6/1998 | Kim et al. ................ 310/328 |
| 5,900,998 A | * | 5/1999 | Kim et al. ................ 359/871 |

FOREIGN PATENT DOCUMENTS

| | | | |
|---|---|---|---|
| EP | 1 017 116 A2 | 7/2000 | |
| EP | 1017116 | * 7/2002 | ............ H01L/41/09 |
| JP | 05-196880 | * 6/1993 | ............ H04N/5/74 |
| JP | 5-196880 | 8/1993 | |
| JP | 11-72724 | 3/1999 | |

\* cited by examiner

*Primary Examiner*—Nestor Ramirez
*Assistant Examiner*—Karen Addison
(74) *Attorney, Agent, or Firm*—Burr & Brown

(57) ABSTRACT

A piezoelectric/electrostrictive device includes a functional element. The functional element includes a base portion; a deformable portion assuming the form of a thin plate and extending from the base portion to thereby form a plane; a piezoelectric/electrostrictive element formed on the deformable portion; and a reflective portion extending from the deformable portion so as to form an active plane intersecting with the plane of the deformable portion, and having a light-reflecting member disposed on the active plane. Operation of the piezoelectric/electrostrictive element causes the deformable portion to be deformed in a direction substantially perpendicular to the plane of the deformable portion to thereby change a reflection angle of light reflected from the reflective portion.

16 Claims, 34 Drawing Sheets

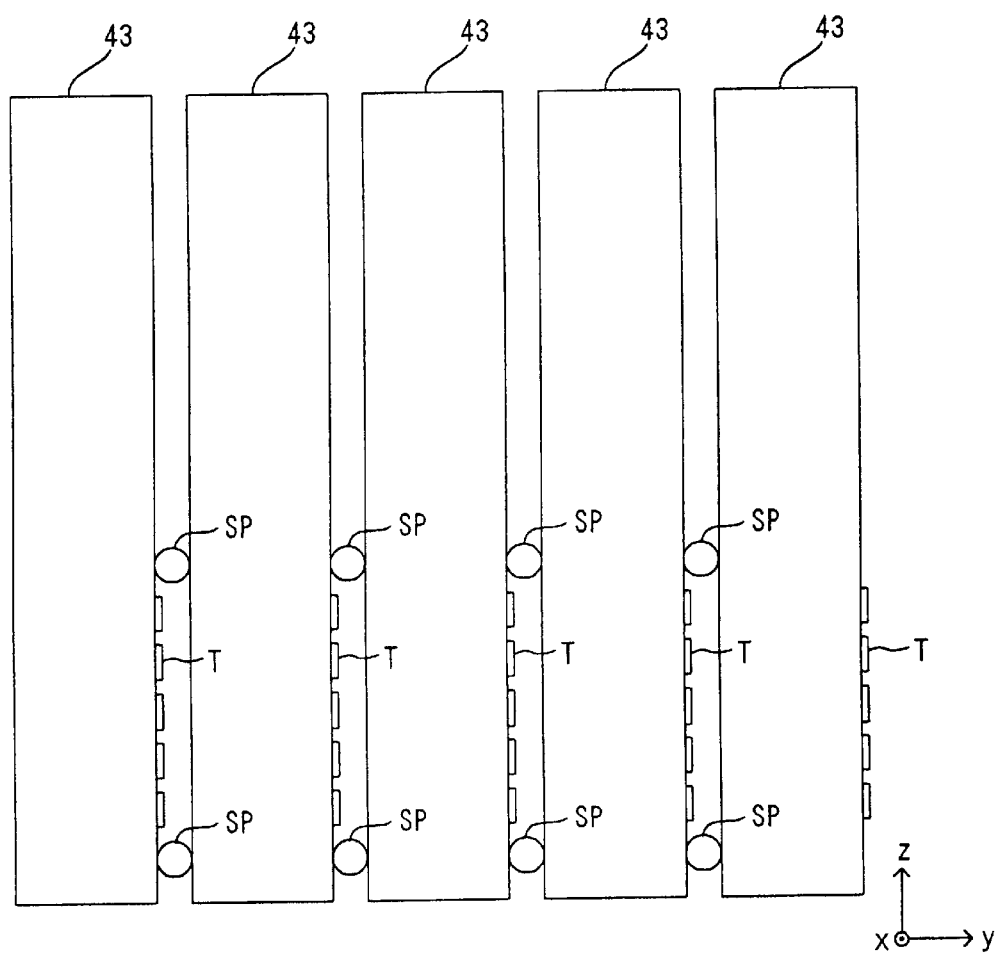

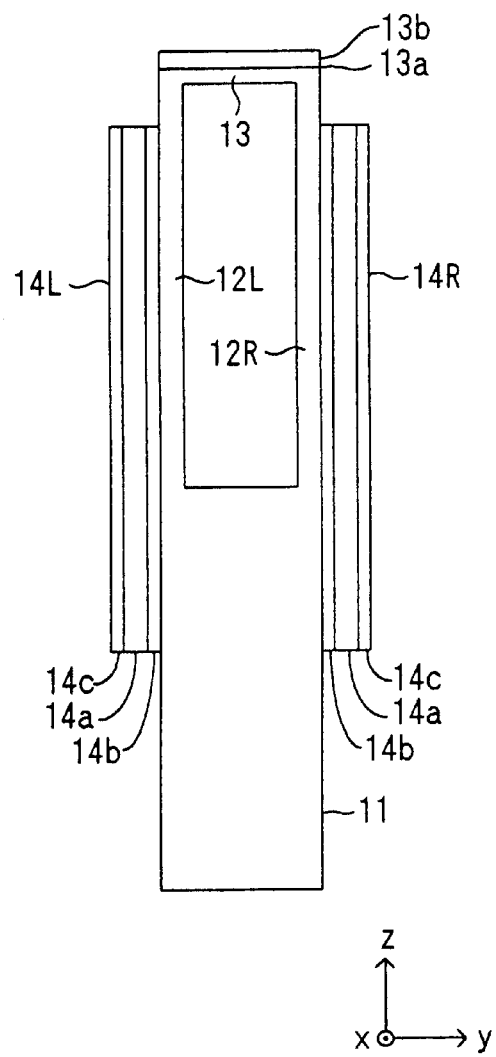

US 6,624,549 B2

PIEZOELECTRIC/ELECTROSTRICTIVE DEVICE AND METHOD OF FABRICATING THE SAME

BACKGROUND OF THE INVENTION

1. Field of the Invention

The present invention relates to a piezoelectric/electrostrictive device having a light modulation mechanism for use in an image display unit, an image printing unit, an exposure unit, an optical switch, or a like apparatus.

2. Description of the Related Art

Recently, various devices having light modulation mechanisms have been developed. For example, Japanese Patent Application Laid-Open (kokai) No. 5-196880 discloses a deformable mirror device (hereinafter called a DMD). As shown in the schematic perspective view of FIG. 33, the DMD includes a CMOS substrate 200; two support elements 202 disposed on the substrate 200; a pair of torsion hinges 204 supported by the support elements 202; a yoke 206 supported by the support elements 202 via the torsion hinges 204; and a mirror 208 supported by the yoke 206. The torsion hinges 204 are twisted through utilization of electrostatic attraction, to thereby change the angle of the mirror 208. For easy understanding, the mirror 208 in FIG. 33 is represented as being transparent.

The DMD is said to enable reduction in device size and highly dense arrangement of pixels. However, since the torsion hinges 204 are twisted so as to drive the mirror 208, the torsion hinges 204 tend to suffer fatigue. Also, since electrostatic attraction is utilized for driving the mirror 208, the mirror 208 may be stuck during operation.

As shown in the schematic sectional view of FIG. 34, a thin-film actuated mirror array (hereinafter called AMA) disclosed in Japanese Patent Application Laid-Open (kokai) No. 11-72724 includes an actuating portion 312 supported by an anchor 302 formed on a substrate 300. The actuating portion 312 consists of a support layer 304 supported by the anchor 302, a bottom electrode 306 formed on the support layer 304, a deformable layer 308 containing a piezoelectric substance and formed on the bottom electrode 306, and a top electrode 310 formed on the deformable layer 308. A stress balance layer 316 is supported on the actuating portion 312 via the post 314, and a light-reflecting member 318 is formed on the stress balance layer 316. Voltage is applied between the bottom electrode 306 and the top electrode 310 so as to deform the deformable layer 308. Through deformation of the deformable layer 308, the actuating portion 312 is inclined, to thereby incline the light-reflecting member 318. For changing the angle of the light-reflecting member 318 the AMA utilizes deformation of the deformable layer 308 containing a piezoelectric material instead of torsional movement of a torsion hinge. As a result, a drive part is less likely to suffer fatigue. Also, since the AMA does not employ electrostatic attraction, the light-reflecting member 318 is unlikely to become stuck.

However, the AMA involves the following drawbacks. Since the light-reflecting member 318 is formed in parallel with the deformable layer 308, the length of the deformable layer 308 must be increased when a large deflection angle (the angle of tilt of reflective surface) is required. As a result, the size of the element increases. Also, since the light-reflecting member 318 is formed of a thin metal film, whose rigidity is low, the reflective surface implemented by the light-reflecting member 318 encounters difficulty in maintaining flatness. Since the flatness of the reflective surface changes with time as a result of operation of the AMA, the operation of deflecting the reflective surface cannot be performed stably over a long period of time.

SUMMARY OF THE INVENTION

An object of the present invention is to solve the above problems involved in the DMD and the AMA and to provide a piezoelectric/electrostrictive device enabling an increase of deflection angle without involvement of an increase in the size of an element and which is less susceptible to time-course deterioration in a drive part, as well as to provide a method for fabricating the device.

To achieve the above object, the present invention provides a piezoelectric/electrostrictive device comprising a functional element, which, in turn, comprises a base portion; a deformable portion assuming the form of a thin plate and extending from the base portion to thereby form a plane; a piezoelectric/electrostrictive element tightly fixed to at least the deformable portion; and a reflective portion extending from the deformable portion so as to form an active plane intersecting with the plane of the deformable portion, and having a light-reflecting member disposed on the active plane. Upon operation of the piezoelectric/electrostrictive element, the deformable portion deforms in a direction substantially perpendicular to the plane of the deformable portion to thereby change a reflection angle of light reflected from the reflective portion.

In order to change the reflection angle of light reflected from the light-reflecting member disposed on the reflective portion, the piezoelectric/electrostrictive element causes the thin deformable portion to be deformed in a direction substantially perpendicular to the plane of the deformable portion. Thus, no torsion is exerted on the deformable portion, which serves as a drive portion. Therefore, the deformable portion is unlikely to deteriorate with time. Also, since the active plane of the reflective portion on which the light-reflecting member is disposed is arranged in such a manner as to intersect with the plane of the deformable portion, even when the length of the deformable portion is increased in order to increase the deflection angle (the angle of tilt of reflective surface), there is no need to increase the length of the light-reflecting member in association with the increase in the length of the deformable portion. Accordingly, the above-described configuration enables provision of a piezoelectric/electrostrictive device of small size and high reliability, thereby enabling highly dense arrangement of pixels in application to, for example, an image display unit. Notably, the degree of reduction in the size of the piezoelectric/electrostrictive device becomes greatest when the active plane of the reflective portion and the plane of the deformable portion intersect at right angles.

In the above piezoelectric/electrostrictive device, the reflective portion preferably extends from an end part of the deformable portion while having a width substantially equal to that of the deformable portion.

Since the conventional AMA mentioned previously has the light-reflecting member supported at a single point by means of the post, the light-reflecting member tends to be deformed (twisted or warped) under its own weight. Thus, the AMA encounters difficulty in maintaining good flatness of the reflective surface over a long period of time. By contrast, the piezoelectric/electrostrictive device of the present invention is configured such that the reflective portion extends from an end part of the deformable portion while having a width substantially equal to that of the deformable portion. Thus, the reflective portion is supported over a long distance and can be enhanced in rigidity. Therefore, the reflective portion is unlikely to be deformed and can maintain good flatness of the reflective surface.

The piezoelectric/electrostrictive device of the present invention may be configured such that a plurality of functional elements are arranged linearly adjacent to one another, to thereby enable application to an optical switch, an exposure unit, or a like unit. In this case, the plurality of functional elements preferably have the respective base portions formed into a common base portion.

The piezoelectric/electrostrictive device of the present invention can be configured such that a plurality of functional elements are arranged in a matrix and adjacent to one another, to thereby enable application to an optical switch, an image display unit, an exposure unit, or a like unit. In this case, at least a column of functional elements in the matrix preferably have the respective base portions formed into a common base portion.

Further, the piezoelectric/electrostrictive device of the present invention is preferably configured such that the base portion, the deformable portion, and the reflective portion of the functional element are formed of a unitary body of ceramics.

By virtue of characteristics of ceramics, the deformable portion can be formed thin and readily deformable in the direction of thickness and does not cause permanent elongation within the plane thereof, which would otherwise result from repeated deformation as in the case of a metal film. Also, since the base portion, the deformable portion, and the reflective portion are formed of a unitary body without use of adhesive, the present invention provides a piezoelectric/electrostrictive device of small size having a light modulation mechanism and exhibiting desirable characteristics and excellent durability.

In this case, preferably, the piezoelectric/electrostrictive element is a film-type piezoelectric/electrostrictive element and is integrated with the deformable portion through firing.

Accordingly, the piezoelectric/electrostrictive element of small size can be easily formed, and the operating voltage of the piezoelectric/electrostrictive device can be lowered. Since there is no need to bond the piezoelectric/ electrostrictive element to the deformable portion by use of, for example, adhesive, strain that the piezoelectric/ electrostrictive element generates can be efficiently utilized without involvement of any loss.

The present invention provides another piezoelectric/ electrostrictive device comprising a functional element, which, in turn, comprises a base portion; a deformable portion assuming the form of a thin plate and extending from the base portion to thereby form a plane; a piezoelectric/ electrostrictive element tightly fixed to at least the deformable portion; a reflective portion extending from the deformable portion so as to form an active plane intersecting with the plane of the deformable portion, and having a light-reflecting member disposed on the active plane; and a holder portion extending from the base portion in opposition to the deformable portion to thereby hold a part of the reflective portion. Upon operation of the piezoelectric/electrostrictive element, the deformable portion deforms in a direction substantially perpendicular to the plane of the deformable portion to thereby change a reflection angle of light reflected from the reflective portion without deformation of the holder portion.

The present piezoelectric/electrostrictive device is similar to the previously mentioned piezoelectric/electrostrictive device of the present invention, except that a holder portion extends from the base portion in opposition to the deformable portion to thereby hold a part of the reflective portion. The holder portion is formed in such a structure (for example, in a rigid structure) as not to be deformed even when the piezoelectric/electrostrictive element causes the deformable portion to be deformed with a resultant change in a reflection angle of light reflected from the reflective portion.

Accordingly, the present piezoelectric/electrostrictive device not only provides advantages similar to those of the previously mentioned piezoelectric/electrostrictive device of the present invention, but also can prevent deviation of an optical axis from the reflective portion when the reflective portion is driven in order to change the reflection angle of light reflected from the reflective portion, since the holder portion prevents the center of tilting motion of the reflective portion from moving with respect to the base portion.

In this case, the reflective portion preferably extends from an end part of the deformable portion while having a width substantially equal to that of the deformable portion.

Since the reflective portion is supported over a long distance by means of the deformable portion and can be enhanced in rigidity, the reflective portion is unlikely to be deformed and can maintain good flatness of the reflective surface.

The present piezoelectric/electrostrictive device may be configured such that a plurality of functional elements are arranged linearly adjacent to one another, to thereby enable application to an optical switch, an image display unit, an exposure unit, or a like unit. In this case, the plurality of functional elements preferably have the respective base portions formed into a common base portion.

The present piezoelectric/electrostrictive device can be configured such that a plurality of functional elements are arranged in a matrix and adjacent to one another, to thereby enable application to an optical switch, an image display unit, or exposure unit, or a like unit. In this case, at least a column of functional elements in the matrix preferably have the respective base portions formed into a common base portion.

Further, the present piezoelectric/electrostrictive device is preferably configured such that the base portion, the deformable portion, the reflective portion, and the holder portion of the functional element are formed of a unitary body of ceramics.

By virtue of characteristics of ceramics, the deformable portion can be formed thin and readily deformable in the direction of thickness and does not cause permanent elongation within the plane thereof, which would otherwise result from repeated deformation as in the case of a metal film. Also, since the base portion, the deformable portion, the reflective portion, and the holder portion are formed of a unitary body without use of adhesive, the present invention provides a piezoelectric/electrostrictive device of small size having a light modulation mechanism and exhibiting desirable characteristics and excellent durability.

In this case, preferably, the piezoelectric/electrostrictive element is a film-type piezoelectric/electrostrictive element and is integrated with the deformable portion through firing.

Thus, the piezoelectric/electrostrictive element of small size can be easily formed, and the operating voltage of the piezoelectric/electrostrictive device can be lowered. Since there is no need to bond the piezoelectric/electrostrictive element to the deformable portion by use of, for example, adhesive, strain that the piezoelectric/electrostrictive element generates can be efficiently utilized without involvement of any loss.

The present invention further provides a method for fabricating a piezoelectric/electrostrictive device in which a thin (thin wall-like) deformable portion made of ceramics and extending from a thick (thick wall-like) base portion formed of ceramics is deformed by a piezoelectric/ electrostrictive element tightly fixed to at least the deformable portion to thereby change angle of a reflective portion made of ceramics and extending from the deformable portion. The method comprises a lamination step of placing a ceramic green sheet on another ceramic green sheet having a substantially rectangular through-hole at a central portion thereof, in such a manner as to cover the through-hole; a firing step of firing the laminated ceramic green sheets to thereby form a unitary body of ceramics having a thick (thick wall-like) portion and a thin (thin wall-like) portion; an element forming step of forming a piezoelectric/ electrostrictive element on at least the thin (thin wall-like) portion; a first cutting step of cutting off a part of the thick (thick wall-like) portion from the unitary body so as to leave a residual thick (thick wall-like) portion having a predetermined thickness as measured from an end of the thin (thin wall-like) portion; and a second cutting step of cutting the residual thick portion along a plane perpendicularly intersecting with a cut surface formed as a result of cutting in said first cutting step, to thereby form the reflective portion having the predetermined thickness, the thin (thin wall-like) deformable portion, and the thick (thick wall-like) base portion.

By this method, in particular, the piezoelectric/ electrostrictive device having a plurality of functional elements arranged thereon linearly or in a matrix and adjacent to one another can be fabricated efficiently in a reduced number of steps.

In this case, the method of the present invention preferably comprises the additional steps of preparing a plurality of unitary bodies of ceramics having undergone the first cutting step but not having undergone the second cutting step, and bonding the plurality of unitary bodies of ceramics at those parts of the thick (thick wall-like) portions which are to become base portions, while spacers are interposed therebetween; and forming a light-reflecting member on the reflective portions.

Thus, the piezoelectric/electrostrictive device having a plurality of functional elements, each having the reflective portion, arranged linearly or in a matrix and adjacent to one another can be easily fabricated. Also, the device can be fabricated while the distance between the unitary bodies is managed accurately and simply by means of the spacers.

The second cutting step preferably is a step of cutting at least the residual thick (thick wall-like) portion formed as a result of cutting in the first cutting step, the light-reflecting member, and the thin portion.

Thus, the base portion, the deformable portion, and the reflective portion can be simultaneously formed in a single cutting operation in the second cutting step.

Further, the step of forming a piezoelectric/ electrostrictive element may be a step of forming a plurality of piezoelectric/electrostrictive elements arranged such that substantially the same clearance is established therebetween; the method of the present invention may comprise an additional step of slitting, before the second cutting step, the thin (thin wall-like) portion between the piezoelectric/ electrostrictive elements to thereby form slits in the thin (thin wall-like) portion; and the second cutting step may be a step of cutting at least the residual thick (thick wall-like) portion formed as a result of cutting in the first cutting step, and the light-reflecting member, along planes aligned with the slits. Further, in this case, the slitting step of slitting the thin (thin wall-like) portion preferably is a step of forming the slits in the thin (thin wall-like) portion through laser beam processing; and the second cutting step preferably is a step of cutting, through laser beam processing, the residual thick (thick wall-like) portion and the light-reflecting member.

Since the thin (thin wall-like) portion is slit at positions located along or between the piezoelectric/electrostrictive elements, the second cutting step can be a mere step of cutting at least the residual thick (thick wall-like) portion formed as a result of cutting in the first cutting step, and the light-reflecting member, along planes aligned with the slits. As a result, load (stress) to be imposed on the piezoelectric/ electrostrictive device during the second cutting step can be reduced, thereby effectively suppressing occurrence of breakage of a product during fabrication. Through use of laser beam processing for slitting and cutting in the second cutting step, load to be imposed on the device during cutting can be greatly reduced.

In this case, the step of forming the light-reflecting member preferably comprises a step of polishing, before the light-reflecting member is formed, the cut surface formed as a result of cutting in the first cutting step; and the method of the present invention preferably comprises the additional steps of filling a filler into gaps between the plurality of unitary bodies after the plurality of unitary bodies are bonded at the thick (thick wall-like) portions while the spacers are interposed therebetween, and before the polishing step; and removing the filler after the second cutting step.

As mentioned above, after the plurality of unitary bodies are bonded at the thick (thick wall-like) portions while the spacers are interposed therebetween, and before the light-reflecting member is formed, a filler is filled into gaps between the plurality of unitary bodies, followed by polishing the surface on which the light-reflecting member is to be formed. Subsequently, the light-reflecting member is formed on the polished surface. Then, at least the light-reflecting member and the residual thick (thick wall-like) portion are cut. Finally, the filler is removed. Since the filler is present between the plurality of unitary bodies during polishing and cutting in the second cutting step, polishing and cutting can be stably performed.

BRIEF DESCRIPTION OF THE DRAWINGS

FIG. 9 is a front view of a piezoelectric/electrostrictive device in process of fabrication as viewed in the step of fabrication shown in FIG. 8A;

FIG. 19 is a front view of a piezoelectric/electrostrictive device according to a seventh embodiment of the present invention;

DETAILED DESCRIPTION OF THE INVENTION

Figure 1:
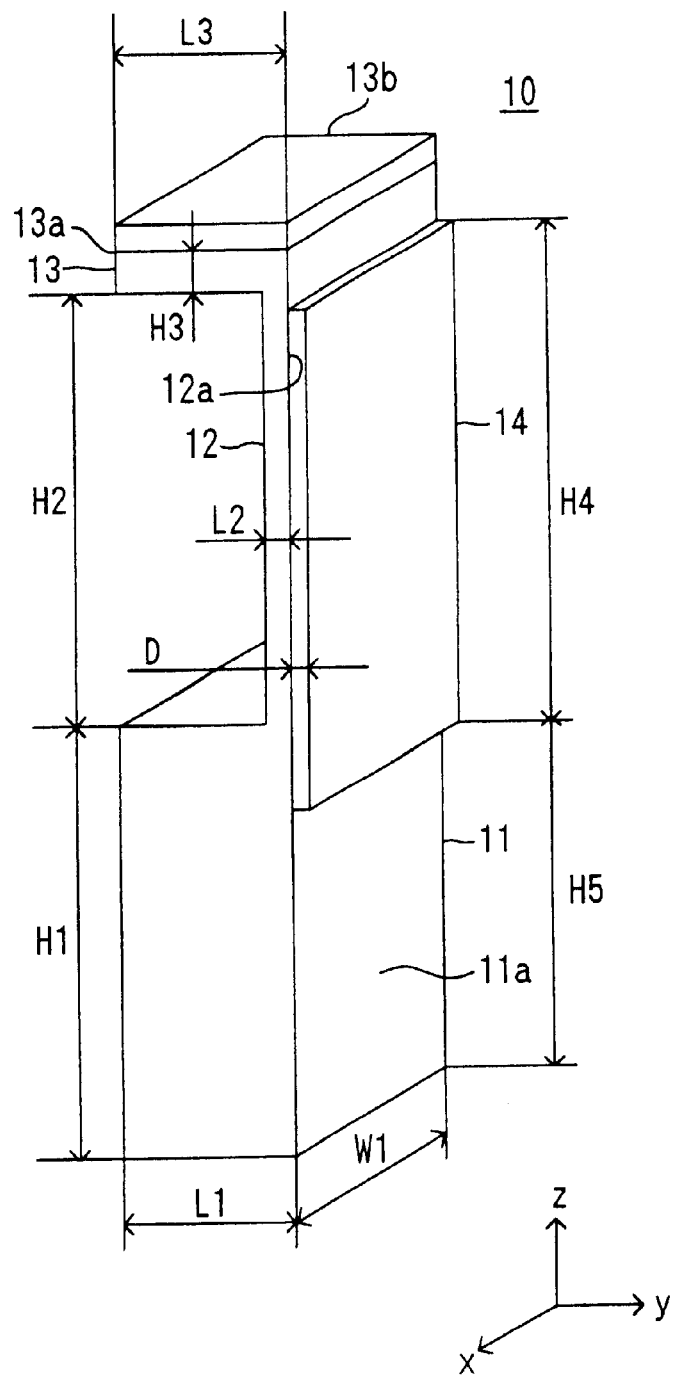
FIG. 1 is a schematic perspective view of a piezoelectric/ electrostrictive device according to a first embodiment of the present invention.

Herein, the term "piezoelectric/electrostrictive" means piezoelectric and/or electrostrictive. A piezoelectric/electrostrictive element is a widely known element that expands in parallel with an externally applied electric field and contracts in a direction perpendicular to the electric field, and is used to convert electric energy to and from mechanical energy. A piezoelectric element is characterized by a relatively large magnitude of coercive electric field (external electric field at which inversion of polarization occurs), whereas an electrostrictive element is characterized by a very small magnitude of coercive electric field.

Embodiments of the piezoelectric/electrostrictive device and the method for fabricating the same according to the present invention will next be described in detail with reference to the drawings. The x-, y-, and z-axes appearing in the drawings are of a rectangular coordinate system. Dimensions of constituent portions of a piezoelectric/electrostrictive device along the x-, y-, and z-axes are called width, thickness or depth, and height, respectively.

First Embodiment

Figure 2:
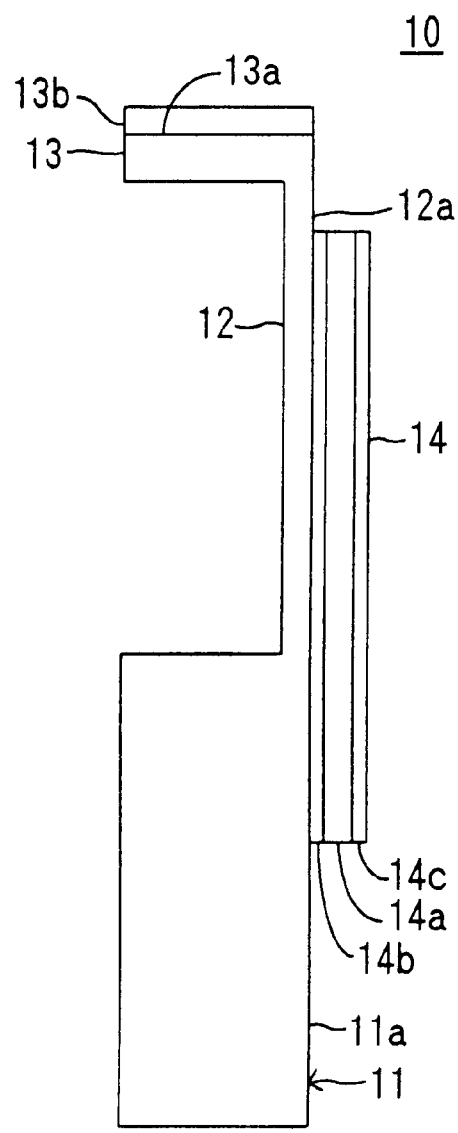
FIG. 2 is a front view of the piezoelectric/electrostrictive device of FIG. 1.

FIG. 1 is a schematic perspective view of a piezoelectric/electrostrictive device 10 according to a first embodiment of the present invention, and FIG. 2 is a front view of the device 10. The piezoelectric/electrostrictive device 10 includes a base portion 11, a deformable portion 12, a reflective portion 13, and a piezoelectric/electrostrictive element 14, which constitute a functional element (one set of functional element) having a light modulation function.

The base portion 11 is made of ceramics whose major component is a partially stabilized zirconia, and is a solid, rigid block having a width W1, a thickness L1, and a height H1 and assuming substantially the form of a rectangular parallelepiped. The width W1 is substantially equal to or slightly greater than the thickness L1. The height H1 is greater than the width W1 and the thickness L1. These dimensions are determined as appropriate according to application of the piezoelectric/electrostrictive device 10.

The deformable portion 12 is made of the same ceramics as that of the base portion 11 and is formed integrally with the base portion 11. The deformable portion 12 is a flexible thin-plate body (vibration plate) having the width W1, a thickness L2, and a height H2 and assuming substantially the form of a rectangular parallelepiped. The deformable portion 12 is readily deformable in the y-axis direction. The thin (thin wall-like) deformable portion 12 extends from the thick (thick wall-like) base portion 11 in the height direction while having the same width W1 as that of the base portion 11. The deformable portion 12 defines a plane 12a aligned with a plane 11a of the base portion 11. Since the plane 12a is deformed as will be described later, the plane 12a is also called a deformable plane 12a.

The reflective portion 13 is made of the same ceramics as that of the base portion 11 and the deformable portion 12 and is formed integrally with the base portion 11 and the deformable portion 12. The reflective portion 13 is a thin-plate body having the width W1, a depth L3, and a height H3 and assuming substantially the form of a rectangular parallelepiped. The height H3 is greater than the thickness L2 of the deformable portion 12, to thereby render the reflective portion 13 undeformable. However, such a dimensional relationship is not the only means for preventing deformation of the reflective portion 13.

The reflective portion 13 extends from an end part of the deformable portion 12 (an end part opposite the base portion 11) while having the same width W1 as that of the deformable portion 12, to thereby form an active plane 13a, which intersects at right angles with the plane 12a of the deformable portion 12. A light-reflecting member 13b formed of a thin aluminum film is disposed on the active plane 13a to thereby form a reflective surface in parallel with the active plane 13a. The reflective surface reflects light incident to the reflective portion 13 (light-reflecting member 13b). In the present embodiment, the depth L3 of the reflective portion 13 is equal to the thickness L1 of the base portion 11.

The piezoelectric/electrostrictive element 14 assumes substantially the form of a rectangular parallelepiped (the form of a thin plate) having the same width W1 as that of the deformable portion 12, a length H4, and a thickness D. More specifically, as shown in FIG. 2, the piezoelectric/electrostrictive element 14 is composed of a film-like piezoelectric/electrostrictive layer 14a made of piezoelectric ceramics, a film-like first electrode 14b made of platinum, and a second electrode 14c made of gold. The piezoelectric/electrostrictive layer 14a is sandwiched between the first electrode 14b and the second electrode 14c. The first electrode 14b is tightly fixed to the deformable portion 12 and the base portion 11 in such a manner as to cover most portion of the plane 12a of the deformable portion 12 and an upper portion of the plane 11a of the base portion 11 (the upper portion is located at and above a height H5 as measured from the bottom surface of the base portion 11, wherein the height H5 is lower than the height H1 of the base portion 11). Thus, the piezoelectric/electrostrictive element 14 is tightly fixed to the deformable portion 12 and the base portion 11 in such a manner as to cover most portion of the plane 12a of the deformable portion 12 and the upper portion of the plane 11a of the base portion 11. An unillustrated circuit (drive circuit) establishes a predetermined electric potential difference (drive voltage) between the first and second electrodes 14b and 14c, to thereby apply an electric field to the piezoelectric/electrostrictive layer 14a in the direction of thickness D.

Next, the operation of the thus-configured piezoelectric/electrostrictive device 10 will be described. When no voltage is applied to the first electrode 14b and the second electrode 14c, the piezoelectric/electrostrictive device 10 is in the state shown in FIG. 2. When voltage is applied to the first electrode 14b and the second electrode 14c from an unillustrated drive circuit to thereby establish a predetermined electric potential difference therebetween, an electric field is applied to the piezoelectric/electrostrictive layer 14a in the direction of thickness D. As a result, the piezoelectric/electrostrictive layer 14a contracts in a direction perpendicular to the electric field.

Figure 3:
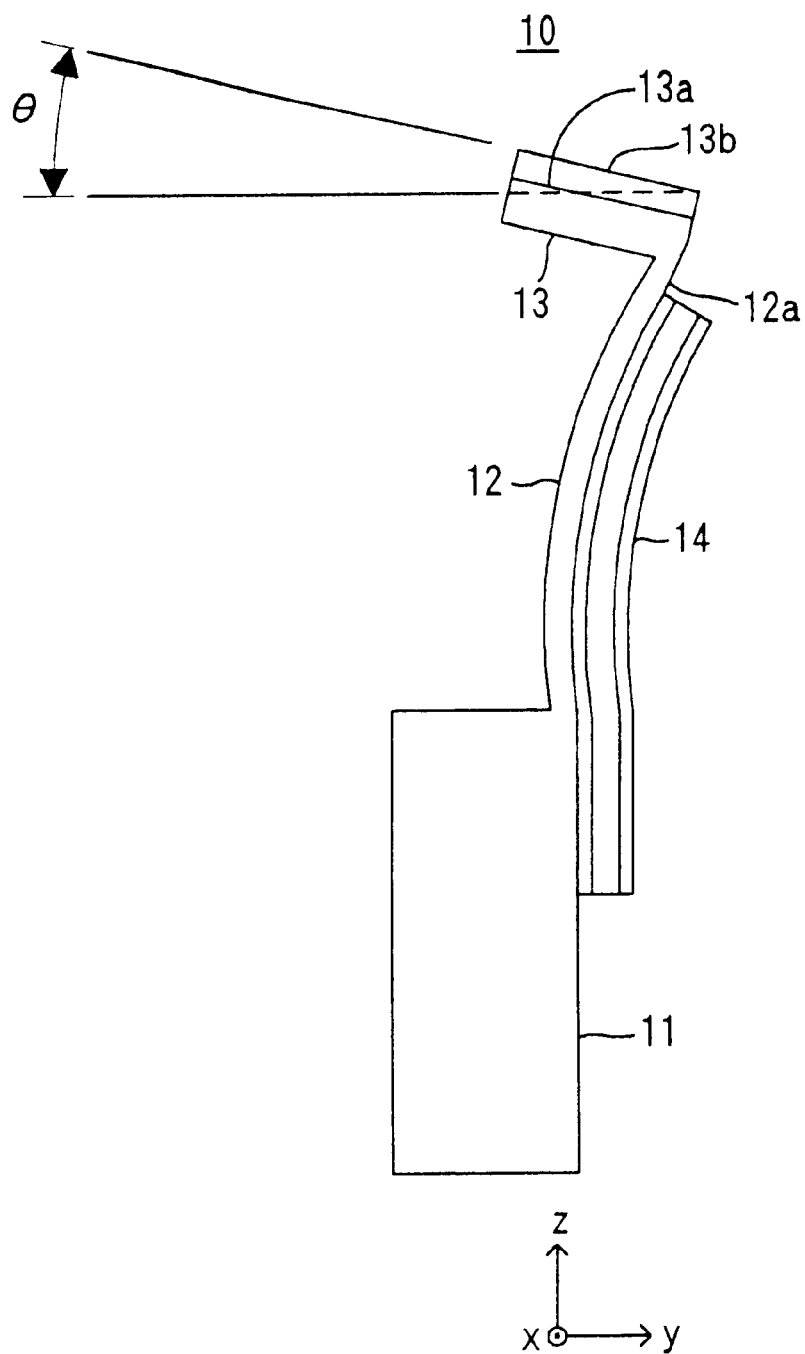
FIG. 3 is a front view of the piezoelectric/electrostrictive device of FIG. 1 as viewed when a deformable portion of the piezoelectric/electrostrictive device is displaced.

Since the first electrode 14b is tightly fixed to most of the deformable portion 12, the piezoelectric/electrostrictive layer 14a contracts at the second electrode 14c side while being prevented from contracting at the first electrode 14b side. Thus, as shown in FIG. 3, the deformable portion 12 is arcuately bent in a direction substantially perpendicular to the deformable plane 12a (plane 12a). As a result, the angle of the light-reflecting member 13b formed on the reflective portion 13 changes by θ. The piezoelectric/electrostrictive device 10 utilizes this action for changing the direction of reflection of light incident to the light-reflecting member 13b, thereby implementing the light modulation function.

According to the above described first embodiment, the reflective surface (the active surface 13a of the reflective portion 13) defined by the reflective portion 13 (the light-reflecting member 13b) intersects at right angles with the deformable plane 12a. Thus, through increase in the height H2 of the deformable portion 12, a change in the angle of the light-reflecting member 13b (i.e., a change in the reflection angle of light) can be increased. Since, even when a change in the angle of the light-reflecting member 13b is increased, the size of the reflective portion 13 (the light-reflecting member 13b) does not need to be increased, the piezoelectric/electrostrictive device 10 can implement a desired light modulation function while maintaining a small size. Thus, in application to, for example, image display, the piezoelectric/electrostrictive device 10 can achieve highly dense arrangement of pixels.

Since the piezoelectric/electrostrictive device 10 is configured such that the reflective portion 13 is bent (extends) from the deformable portion 12 while having the same width W1 as that of the deformable portion 12, the rigidity of the reflective portion 13 can be enhanced. Therefore, strain is unlikely to be generated in the reflective portion 13. Since the light-reflecting member 13b is formed on the active plane 13a of the rigid reflective portion 13, the flatness of the reflective surface of the light-reflecting member 13b can be maintained at a constant level over a long period of time. As mentioned previously, since the light-reflecting member 13b (reflective surface) can assume a constant size irrespective of the magnitude of reflection angle, the reflective surface can assume stable flatness irrespective of design.

Furthermore, since the piezoelectric/electrostrictive device 10 is configured such that the base portion 11, the deformable portion 12, and the reflection portion 13 are formed of a unitary body of ceramics, by virtue of characteristics of ceramics, the deformable portion 12 can be formed thin (the thickness D is small) and readily deformable in the direction of thickness D and does not cause permanent elongation within the plane 12a thereof, which would otherwise result from repeated deformation as in the case of a metal film. Also, since the base portion 11, the deformable portion 12, and the reflective portion 13 are formed of a unitary body without use of adhesive, the piezoelectric/electrostrictive device 10 implements a light modulation mechanism of small size exhibiting desirable characteristics and excellent durability.

Also, since a portion of the piezoelectric/electrostrictive element 14 is formed on the thick (thick wall-like) base portion 11, the deformable portion 12 is bent while a boundary portion between the base portion 11 and the deformable portion 12 serves as a fulcrum. Thus, strain of the piezoelectric/electrostrictive element 14 can be efficiently converted to bending displacement of the deformable portion 12.

According to the first embodiment, the active plane 13a of the reflective portion 13 (reflective surface of the light-reflecting member 13b) intersects at right angles with the deformable plane 12a of the deformable portion 12. However, the intersecting angle is not limited to a right angle so long as the active plane 13a and the deformable plane 12a intersect each other. Also, the first embodiment is described while mentioning the base portion 11, the deformable portion 12, and the reflective portion 13 which are formed of a unitary body of ceramics. However, the base portion 11, the deformable portion 12, and the reflective portion 13 may be formed of the respectively different members, which are, for example, bonded to assume the form of the first embodiment, so long as the members yield respectively required functions. Furthermore, metal or engineering plastic may replace ceramics.

Second Embodiment

Figure 4:
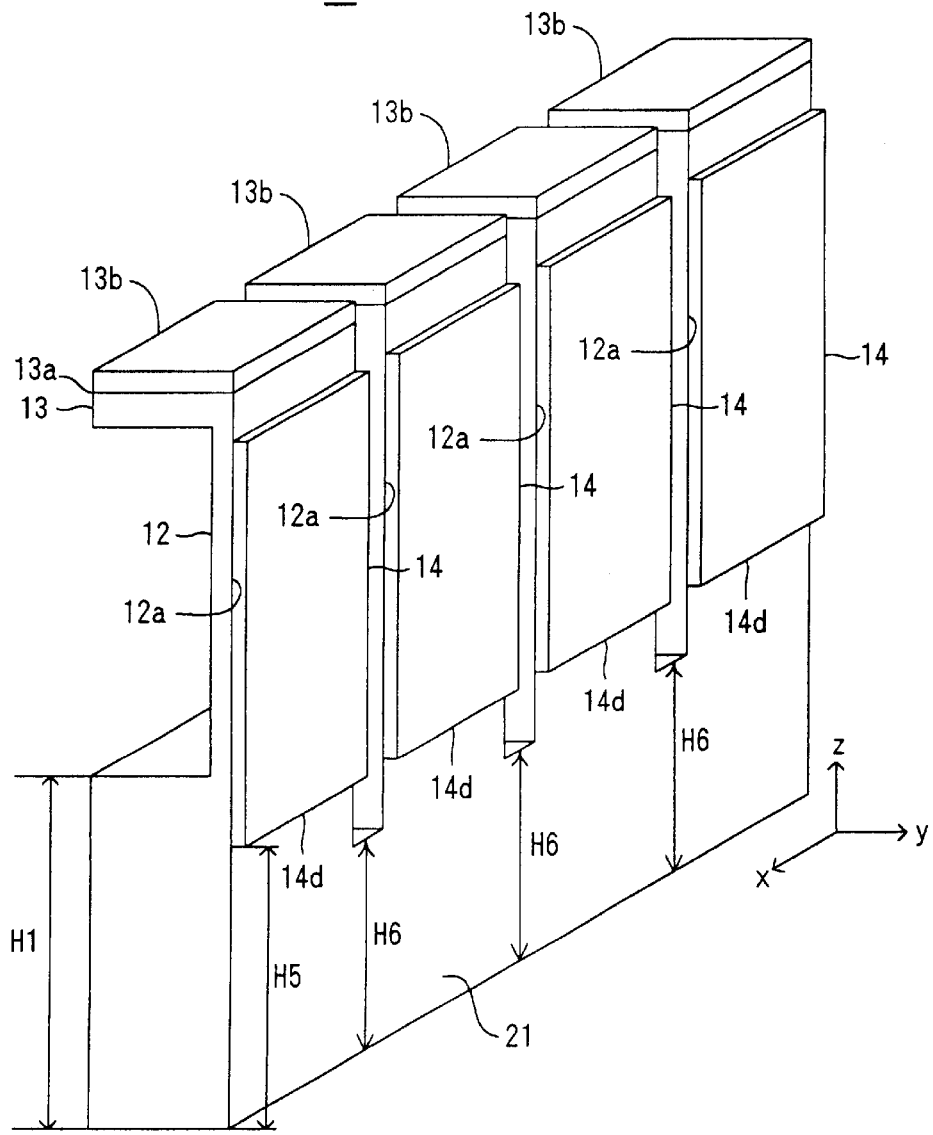
FIG. 4 is a schematic perspective view of a piezoelectric/ electrostrictive device according to a second embodiment of the present invention.

FIG. 4 is a schematic perspective view of a piezoelectric/electrostrictive device 20 according to a second embodiment of the present invention. The piezoelectric/electrostrictive device 20 substantially includes a plurality of piezoelectric/electrostrictive devices 10, each of which forms one set of functional elements, according to the first embodiment. The plurality of piezoelectric/electrostrictive devices 10 are arranged linearly adjacent to one another such that the deformable planes 12a (planes on which the piezoelectric/electrostrictive elements 14 are formed) are present on the same plane, while the reflective planes of the light-reflecting members 13b are present on the same plane. Portions of the piezoelectric/electrostrictive device 20 which each correspond to the base portion 11 of the first embodiment are integrated (connected) into a single base portion 21, which is located below lower ends (ends opposite the reflective portions 13; i.e., ends located in the negative direction of the z-axis) 14d of the piezoelectric/electrostrictive elements 14.

The height H5 of the lower ends 14d of the piezoelectric/electrostrictive elements 14 above the bottom surface of the base portion 21 is lower than the height H1 of the base portion 21. Height H6 of connection parts of the base portion 21 where a part of the base portion 21 corresponding to the base portion 11 is connected with an adjacent part of the base portion 21 corresponding to the base portion 11 is lower than the height H5 of the lower ends 14d. When the height H5 of the lower ends 14d is higher than the height H1 of the base portion 21, the height H6 of the connection parts of the base portion 21 must be equal to or lower than the height H1 of the base portion 21. The thus-formed base portion 21 enables a plurality of deformable portions 12 to be displaced independently of one another.

The piezoelectric/electrostrictive device 20 operates as does the piezoelectric/electrostrictive device 10 of the first embodiment. Specifically, when an electric potential difference is established between the first and second electrodes 14b and 14c (not shown in FIG. 4) of a certain piezoelectric/electrostrictive element 14, strain arises in the piezoelectric/electrostrictive element 14, causing the deformable portion 12 to be arcuately bent in a direction substantially perpendicular to the deformable plane 12a. As a result, the angle of the light-reflecting member 13b formed on the reflective portion 13 changes by θ. The piezoelectric/electrostrictive device 20 utilizes this action for changing the direction of reflection of light incident to the light-reflecting members 13b, thereby implementing the light modulation function. The second embodiment provides the piezoelectric/electrostrictive device 20 having a plurality of reflective surfaces which are arranged linearly and can be changed in reflection angle of light incident thereto independently of one another.

As in the case of the first embodiment, according to the second embodiment, the active plane 13a of each of the reflective portions 13 (reflective surface of each of the light-reflecting members 13b) intersects at right angles with the deformable plane 12a of each of the deformable portions 12. However, the intersecting angle is not limited to a right angle so long as the active plane 13a and the deformable plane 12a intersect each other. The second embodiment is described while mentioning the base portion 21 serving as a common base portion to the deformable portions 12 and the reflective portions 13. However, a plurality of the piezoelectric/electrostrictive devices 10 of the first embodiment may merely be arranged in a column and bonded together such that a predetermined clearance is established therebetween. Also, as in the case of the first embodiment, the second embodiment is described while mentioning the base portion 21, the deformable portions 12, and the reflective portions 13 which are formed of a unitary body of ceramics. However, the base portion 21, the deformable portions 12, and the reflective portions 13 may be formed of the respectively different members, which are, for example, bonded to assume the form of the second embodiment, so long as the members yield respectively required functions.

Third Embodiment

Figure 5:
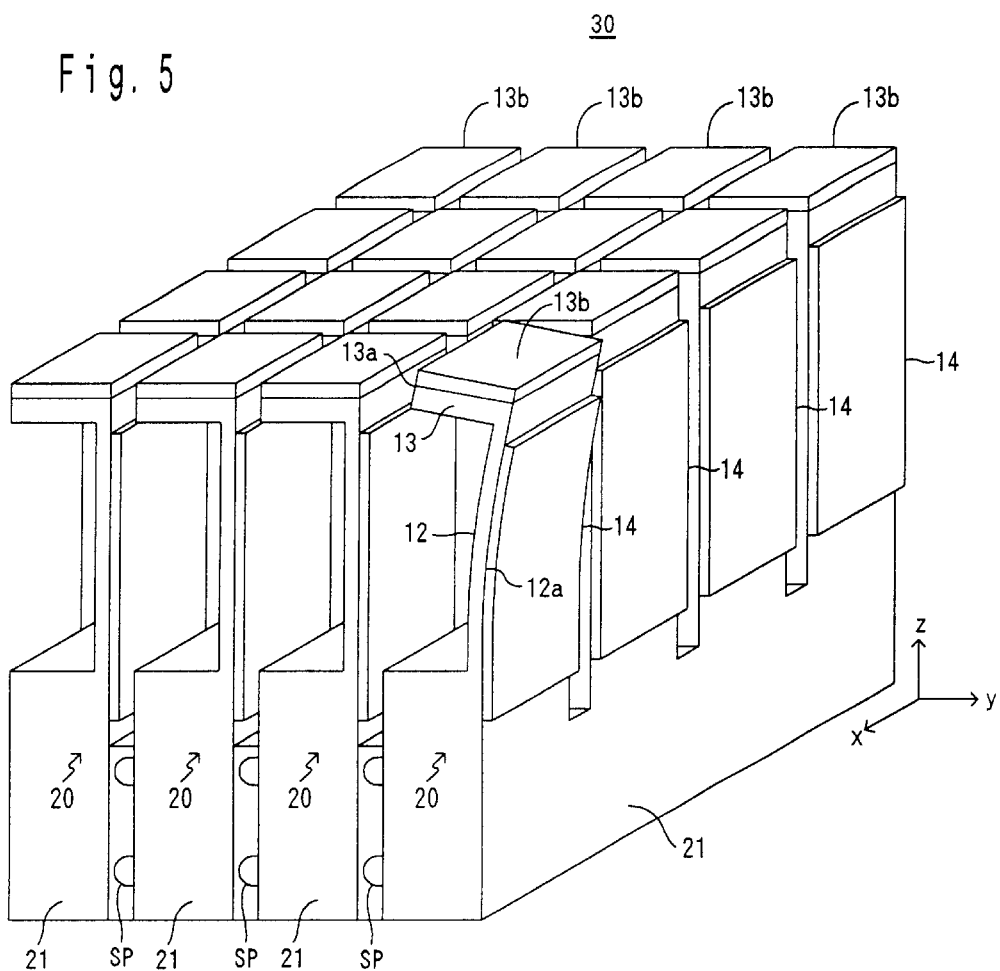
FIG. 5 is a schematic perspective view of a piezoelectric/ electrostrictive device according to a third embodiment of the present invention.

FIG. 5 is a schematic perspective view of a piezoelectric/electrostrictive device 30 according to a third embodiment of the present invention. The piezoelectric/electrostrictive device 30 substantially includes a plurality of piezoelectric/electrostrictive devices 10, each of which forms one set of functional elements, according to the first embodiment. The plurality of piezoelectric/electrostrictive devices 10 are arranged in a matrix and adjacent to one another such that the piezoelectric/electrostrictive devices 10 are oriented in the same direction, while the reflective planes of the light-reflecting members 13b of the piezoelectric/electrostrictive devices 10 are present on the same plane.

More specifically, the piezoelectric/electrostrictive device 30 includes a plurality of piezoelectric/electrostrictive devices 20 according to the second embodiment (extending in a column direction or the x-axis direction) which are arranged in a row direction and bonded together at the base portions 21 by use of adhesive as shown in FIG. 5. Spacers SP are interposed between the base portions 21 so as to maintain a constant distance between the adjacent piezoelectric/electrostrictive devices 20.

The piezoelectric/electrostrictive device 30 operates as does the piezoelectric/electrostrictive device 10 of the first embodiment. Specifically, when an electric potential difference is established between the first and second electrodes 14b and 14c (not shown in FIG. 5) of a certain piezoelectric/electrostrictive element 14, strain arises in the piezoelectric/electrostrictive element 14, causing the deformable portion 12 to be arcuately bent in a direction substantially perpendicular to the deformable plane 12a. As a result, the angle of the light-reflecting member 13b formed on the reflective portion 13 changes by θ. FIG. 5 exemplifies a change in the angle of a single light-reflecting member 13b.

The piezoelectric/electrostrictive device 30 utilizes the above-mentioned action for changing the direction of reflection of light incident to the light-reflecting members 13b, thereby implementing the light modulation function. The third embodiment provides the piezoelectric/electrostrictive device 30 having a plurality of light-reflecting members 13b which are arranged in a matrix and can be changed in reflection angle of light incident thereto independently of one another. Thus, in application to, for example, an image display unit, an exposure unit, or an optical switch, the piezoelectric/electrostrictive device 30 having the light modulation function can achieve a reduction in size and can establish high reproducibility of image. Generally, conventional exposure units require a mask, such as a chromium mask, to order to form image (pattern). By contrast, since an exposure unit using the piezoelectric/electrostrictive device 30 can directly form image by means of image data (electronic information), the exposure unit does not involve troublesome work of preparing a new mask each time design is changed, thereby greatly shortening lead time associated with design change.

Figure 6:
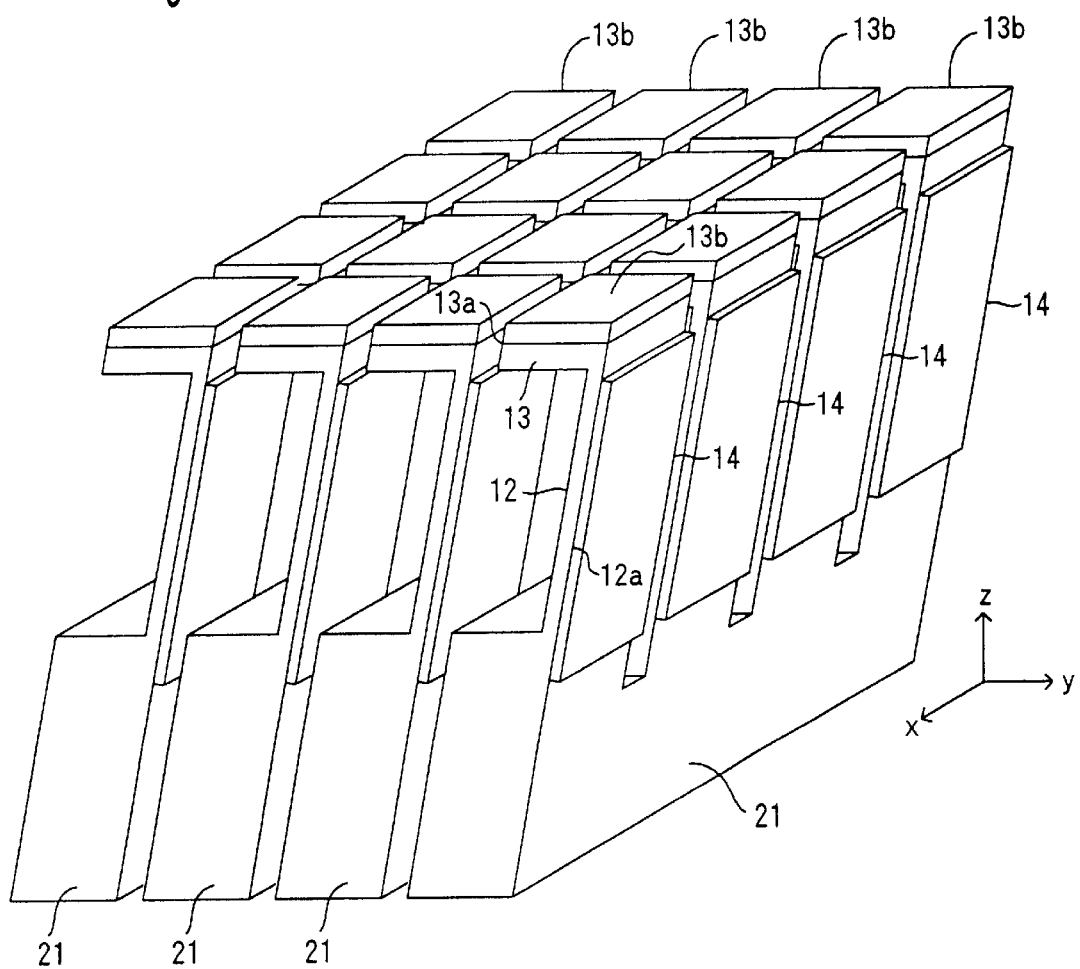
FIG. 6 is a schematic perspective view of a modification of the piezoelectric/electrostrictive device according to the third embodiment.

As in the case of the aforementioned embodiments, according to the third embodiment, the active plane 13a of each of the reflective portions 13 (reflective surface of each of the light-reflecting members 13b) intersects at right angles with the deformable plane 12a of each of the deformable portions 12. However, as shown in FIG. 6, the intersecting angle is not limited to a right angle so long as the active plane 13a (reflective surface) and the deformable plane 12a intersect each other.

The third embodiment is described while mentioning the base portion 21 serving as a common base portion to the deformable portions 12 and the reflective portions 13 in each column. However, a plurality of the piezoelectric/electrostrictive devices 10 of the first embodiment may merely be arranged in a matrix and bonded together such that a predetermined clearance is established therebetween. Also, as in the case of the aforementioned embodiments, the third embodiment is described while mentioning the base portion 21, the deformable portions 12, and the reflective portions 13 which are formed, in each column, into a unitary body of ceramics. However, the base portion 21, the deformable portions 12, and the reflective portions 13 may be formed of the respectively different members, which are, for example, bonded to assume the form of the third embodiment, so long as the members yield respectively required functions.

First Method for Fabricating Piezoelectric/Electrostrictive Device

Figure 7A:
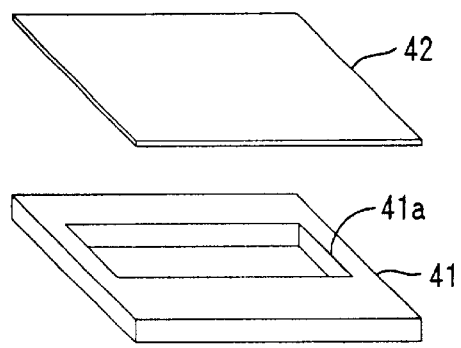
FIGS. 7A, 7B, 7C, and 7D are views showing steps of a first method for fabricating the piezoelectric/electrostrictive device of FIG. 5.

A first method for fabricating the piezoelectric/electrostrictive device 30 will be described with reference to FIGS. 7A to 9. First, as shown in FIG. 7A, a substantially rectangular, thick (thick wall-like) ceramic green sheet 41 is prepared. In a later stage of fabrication, the ceramic green sheet 41 is to be formed into the base portion 21 and the reflective portions 13. A rectangular through-hole 41a is formed in the ceramic green sheet 41 at a substantially central portion thereof through, for example, panching by using a die or laser beam processing. Next, a thin (thin wall-like), as compared with the ceramic green sheet 41, ceramic green sheet 42 is prepared. The ceramic green sheet 42 assumes substantially the same rectangular shape as that of the ceramic green sheet 41 and is to be formed into the deformable portions 12 in a later stage of fabrication.

The ceramic green sheets 41 and 42 are manufactured, for example, by the steps of adding a binder, a solvent, a dispersant, and a plasticizer to a ceramic powder of, for example, zirconia; mixing the resultant mixture to thereby obtain slurry; degassing the slurry; and forming the slurry into the ceramic green sheets 41 and 42 by means of, for example, a reverse-roll coater process or a doctor blade process. In FIG. 7A, the ceramic green sheet 41 is thick as compared with the ceramic green sheet 42. However, the thickness of the ceramic green sheets 41 and 42 is determined as appropriate according to the design of an intended piezoelectric/electrostrictive device. For example, the ceramic green sheets 41 and 42 may assume the same thickness. Furthermore, in FIG. 7A, the ceramic green sheets 41 and 42 are each a single ceramic green sheet. However, each of the ceramic green sheets 41 and 42 may be composed of a plurality of ceramic green sheets, which are compression bonded into laminate. The number and sequence of compressing operations for lamination are not particularly limited.

The above-mentioned compressing process combined with application of heat enhances lamination. Paste or slurry composed predominantly of ceramic powder and a binder may be applied through coating or printing onto a ceramic green sheet for use as a bonding aid layer, to thereby enhance bonding between ceramic green sheets. Preferably, in order to ensure reliability, the ceramic powder contained in the paste or slurry is of the same or a similar composition as that of ceramics used in the ceramic green sheet. When the ceramic green sheets 41 and 42 are thin, the ceramic green sheets 41 and 42 are preferably handled by use of a plastic film, particularly a polyethylene terephthalate film coated with a silicone-based release agent.

Figure 7B:
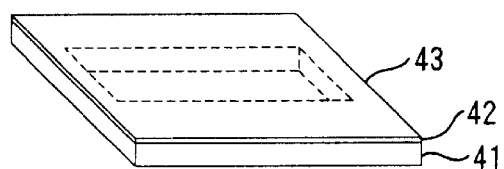

Next, as shown in FIG. 7B, the thin (thin wall-like) ceramic green sheet 42 is placed on the thick (thick wall-like) ceramic green sheet 41 in such a manner as to cover the through-hole 41a, followed by compression bonding. The thus-bonded ceramic green sheets 41 and 42 are fired at a temperature of approximately 1200° C. to 1600° C. to thereby form a unitary body 43 of ceramics having a thin (thin wall-like) portion and a thick (thick wall-like) portion. As a result of integration through firing, the boundary (interface) between the ceramic green sheets 41 and 42 disappears. However, FIGS. 7B–7D shows the boundary (interface) for convenience of understanding.

Figure 7C:
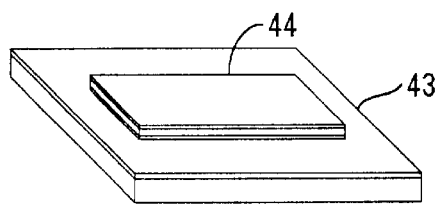
Figure 7D:
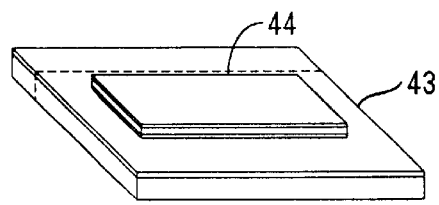

Next, as shown in FIG. 7C, a piezoelectric/electrostrictive element layer 44 is formed through screen printing on the unitary body 43 of ceramics in such a manner as to cover most of the thin (thin wall-like) portion of the unitary body 43. More specifically, an electrode layer which is to become the first electrode 14b is formed on the unitary body 43 of ceramics through screen printing, followed by firing. Then, a layer which is to become the piezoelectric/electrostrictive layer 14a is formed on the formed first electrode 14b through screen printing, followed by firing. Finally, an electrode layer which is to become the second electrode 14c is formed on the formed piezoelectric/electrostrictive layer 14a through screen printing, followed by firing. Through employment of screen printing, film formation and patterning can be simultaneously performed, thereby simplifying the fabrication process. Preferably, the temperature of firing in formation of the piezoelectric/electrostrictive element layer 44 is 500° C. to 1500° C. Particularly preferably, the layer for constituting the piezoelectric/electrostrictive layer 14a is fired at a temperature of 1000° C. to 1400° C. In the step of forming the piezoelectric/electrostrictive element layer 44, terminals T (wiring patterns) for the first electrode 14b and the second electrode 14c are also formed.

Notably, the first electrode 14b is made of platinum (Pt); the piezoelectric/electrostrictive layer 14a is made of lead zirconate titanate (PZT); and the second electrode 14c is made of gold (Au). In this manner, materials for the members are selected such that the materials lower in firing temperature in the ascending order of lamination, thereby avoiding re-sintering a previously fired material at a certain stage of firing and thus avoiding a problem, such as separation or aggregation of an electrode layer.

The method for forming the piezoelectric/electrostrictive element layer 44, terminals, and wiring is not limited to screen printing. Applicable methods include thick-film formation processes, such as a dipping process, a coating process, and an electrophoretic process, and thin-film formation processes, such as an ion beam process, a sputtering process, a vacuum vapor deposition process, an ion plating process, a chemical vapor deposition (CVD) process, and a plating process.

Through application of any of the above film formation processes to formation of the piezoelectric/electrostrictive element layer 44 (i.e., piezoelectric/electrostrictive element 14), the piezoelectric/electrostrictive element 14 can be integrally joined to the deformable portion 12 without use of adhesive, thereby ensuring device reliability and facilitating integration.

Through application of any of the above thick-film formation processes to formation of the piezoelectric/electrostrictive layer 14a, film formation can be achieved by use of, for example, paste, slurry, suspension, emulsion, or sol which contains a predominant amount of piezoelectric ceramic particles or powder having an average particle size of 0.01 μm to 5 μm, preferably 0.05 μm to 3 μm. The thus formed film is fired to thereby obtain the piezoelectric/electrostrictive element layer 44 having favorable piezoelectric/electrostrictive characteristics. The electrophoretic process provides an advantage of capability to form a film at high density and high profile accuracy.

According to the above-described method, firing is performed each time the first electrode 14b, the piezoelectric/electrostrictive layer 14a, or the second electrode 14c is formed through printing. However, simultaneous firing may be performed after the first electrode 14b, the piezoelectric/electrostrictive layer 14a, and the second electrode 14c are formed through printing. Wiring and terminals for connection to an external control equipment (drive circuit) are not illustrated on the drawings; however, in actuality, the wiring and terminals are formed through screen printing as will be described later.

The above method is described while mentioning direct formation of the piezoelectric/electrostrictive element layer 44 on the unitary body 43 of ceramics by means of the above-mentioned film formation process. However, the present invention is not limited thereto. For example, a separately formed piezoelectric/electrostrictive element layer is bonded to the unitary body 43 of ceramics at a predetermined position by means of, for example, a conductive adhesive. The discrete piezoelectric/electrostrictive element layer is formed by the steps of, for example, preparing a green sheet which is to become the piezoelectric/electrostrictive layer 14a; forming electrode layers which is to become the first and second electrodes 14b and 14c, on the green sheet through screen printing; and cutting the resultant unitary body into a predetermined shape, followed by firing. Alternatively, the discrete piezoelectric/electrostrictive element layer is formed by the steps of preparing a green sheet which is to become the piezoelectric/electrostrictive layer 14a; cutting the green sheet to a predetermined size, followed by firing; and forming electrodes which are to become the first and second electrodes 14b and 14c, on the fired body by means of, for example, sputtering. In this case, wiring must be formed on the unitary body 43 of ceramics at a predetermined position in order to establish connection between the piezoelectric/electrostrictive element and a drive circuit.

Next, the unitary body 43 is cut along the dashed line of FIG. 7D. Specifically, a part of the thick (thick wall-like) portion is cut off, by means of a dicing machine, a slicing machine, or a wire saw, from the unitary body 43 such that a part of the thick portion of predetermined height as measured from an end of the thin (thin wall-like) portion (i.e., the covered through-hole 41a) remains along the end of the thin (thin wall-like) portion. The residual thick portion will later be formed into the reflective portions 13. This cutting step is called a first cutting step of convenience.

Figure 8A:
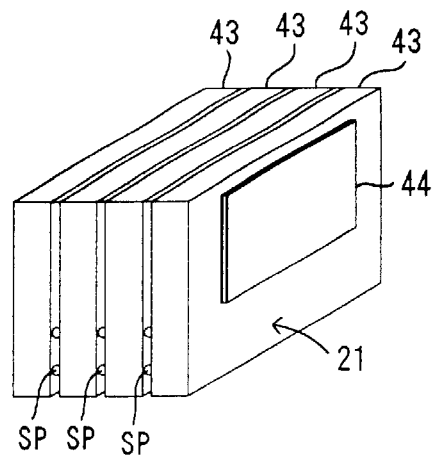
FIGS. 8A, 8B, and 8C are views showing steps of the first method for fabricating the piezoelectric/electrostrictive device of FIG. 5.

Next, as shown in FIGS. 8A and 9, a plurality of unitary bodies 43 of ceramics formed as a result of cutting in the first cutting step are bonded together by means of adhesive while spacers SP are interposed therebetween. Notably, the unitary bodies 43 are bonded at thick (thick wall-like) portions which are to become the base portions 21 and on which terminals T (wiring) are formed. Examples of spacers SP include glass or plastic beads, rods, and plates, and metal shims, and the like. For the bonding, adhesive may be filled into gaps between the base portions 21 with the spacers SP interposed therebetween, or the base portions 21 may be bonded by use of a mixture of adhesive and spacers SP.

Subsequently, a removable filler, such as resin or wax, is filled into gaps between the unitary bodies 43 of ceramics, excluding portions of the gaps corresponding to the above-described bonded portions. At this stage, the top surfaces of the bonded unitary bodies 43 of ceramics are polished.

Figure 8B:
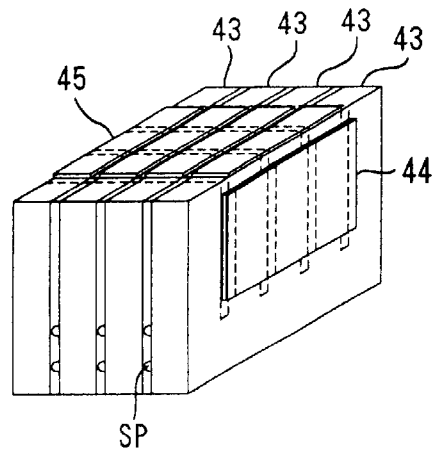

Next, as shown in FIG. 8B, a film 45 of a light-reflecting member is formed on the polished top surfaces through sputtering. Sputtering may be replaced by another thin-film formation process, such as vacuum deposition. In this case, the film 45 of a light-reflecting member may be formed merely on required portions of the top surfaces by use of a mask or formed on the entire top surfaces without use of the mask. In place of formation of the film 45, a bulk body of, for example, metal, which will be described later, may be bonded to the polished top surfaces.

Figure 8C:
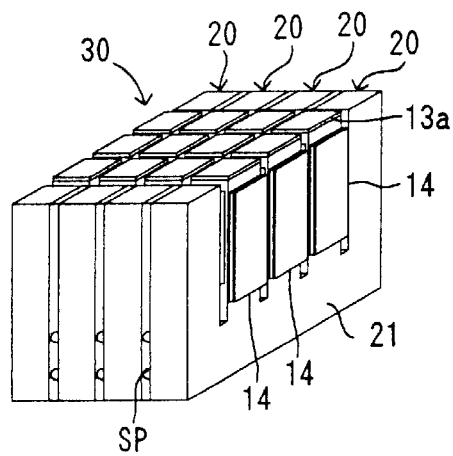

Next, predetermined portions of the bonded unitary bodies 43 are cut along the dashed lines of FIG. 8B by means of a dicing machine, a slicing machine, or a wire saw. Specifically, the residual thick portions formed as a result of cutting in the first cutting step, the film 45 of a light-reflecting member, the thin (thin wall-like) portions, the piezoelectric/electrostrictive element layer 44, and upper parts of base portions 21 are cut at a time along planes intersecting at right angles with the polished top surfaces. This cutting step is call a second cutting step of convenience. Finally, as shown in FIG. 8C, the filler, such as resin or wax, filling the gaps is removed by means of solvent. Thus, the piezoelectric/electrostrictive device 30 is completed.

The first method of fabrication can fabricate the piezoelectric/electrostrictive device 30 having a number of reflective portions which can change the reflection angle independently of one another, according to a simple process. Since the base portions 21 are bonded together while the spacers SP are interposed therebetween, the piezoelectric/electrostrictive device 30 can be fabricated while the distance between the unitary bodies 43 of ceramics is held unchanged in an accurate, simple manner. Since polishing and the second cutting step are carried out while the gaps between the unitary bodies 43 of ceramics are filled with filler, polishing and the second cutting can be stably performed.

Through omission of a part of the above-described first method of fabrication, the piezoelectric/electrostrictive devices 10 and 20 according to the first and second embodiments, respectively, can be fabricated. Specifically, the piezoelectric/electrostrictive device 10 can be fabricated by the steps of preparing the ceramic green sheets 41 and 42 shown in FIG. 7A and having a size corresponding to the piezoelectric/electrostrictive device 10; performing the first cutting step as shown in FIG. 7D; forming a light-reflecting member in a manner similar to that shown in FIG. 8B; and performing the second cutting step as shown in FIG. 8C; i.e., cutting the residual thick portion, the light-reflective member, the deformable portion, etc. The piezoelectric/electrostrictive device 20 can be fabricated through omission of the bonding step shown in FIG. 8A; i.e., by the steps of forming a light-reflecting member on the unitary body 43 of ceramics as shown in FIG. 8B; and performing the second cutting step as shown in FIG. 8C.

Second Method for Fabricating Piezoelectric/Electrostrictive Device

Figure 10A:
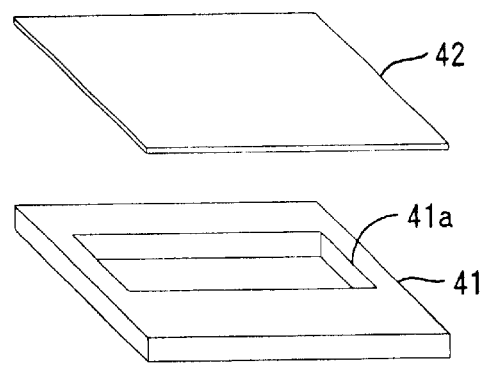
FIGS. 10A, 10B, 10C, and 10D are views showing steps of a second method for fabricating the piezoelectric/electrostrictive device of FIG. 5.

A second method for fabricating the piezoelectric/electrostrictive device 30 will be described with reference to FIGS. 10A–10D and 11A–11C. First, as shown in FIG. 10A, a substantially rectangular, thick (thick wall-like) ceramic green sheet 41 is prepared. In a later stage of fabrication, the ceramic green sheet 41 is to be formed into the base portion 21 and the reflective portions 13. A rectangular through-hole 41a is formed in the ceramic green sheet 41 at a substantially central portion thereof. Next, a thin (thin wall-like) ceramic green sheet 42 is prepared. The ceramic green sheet 42 assumes substantially the same rectangular shape as that of the ceramic green sheet 41 and is to be formed into the deformable portions 12 in a later stage of fabrication. A method for manufacturing the ceramic green sheets 41 and 42, the thickness of the ceramic green sheets 41 and 42, and a method for forming the through-hole 41a are as described above in the first method of fabrication.

Figure 10B:
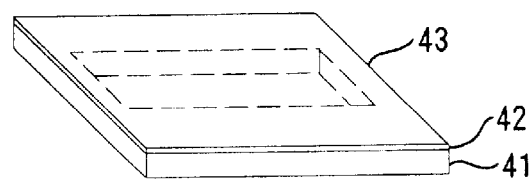

Next, as shown in FIG. 10B, the thin ceramic green sheet 42 is placed on the thick (thick wall-like) ceramic green sheet 41 in such a manner as to cover the through-hole 41a, followed by firing to thereby obtain the unitary body 43 of ceramics having a thin (thin wall-like) portion and a thick (thick wall-like) portion. The steps shown in FIGS. 10A and 10B are similar to those shown in FIGS. 7A and 7B.

Figure 10C:
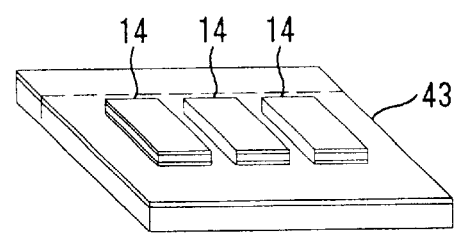

Next, as shown in FIG. 10C, a plurality of rectangular piezoelectric/electrostrictive elements 14 are formed, through screen printing, on at least the thin portion of the unitary body 43 of ceramics. The formed piezoelectric/electrostrictive elements 14 assume the same shape as that of the finally obtained piezoelectric/electrostrictive elements 14 and are arranged adjacent one another while a constant gap is established therebetween. Specifically, each of the piezoelectric/electrostrictive elements 14 is formed in the following manner. A layer which is to become the first electrode 14b is formed on the unitary body 43 of ceramics through screen printing, followed by firing. Then, a layer which is to become the piezoelectric/electrostrictive layer 14a is formed on the formed first electrode 14b through screen printing, followed by firing. Finally, a layer which is to become the second electrode 14c is formed on the formed piezoelectric/electrostrictive layer 14a through screen printing, followed by firing. At the time of formation of the layers which are to become the first and second electrodes 14b and 14c, corresponding terminals T (wiring patterns) are also formed through screen printing.

Next, the unitary body 43 is cut along the dashed line of FIG. 10C. Specifically, a part of the thick (thick wall-like) portion is cut off, by means of a dicing machine, a slicing machine, or a wire saw, from the unitary body 43 such that a part of the thick (thick wall-like) portion of predetermined height as measured from an end of the thin (thin wall-like) portion (i.e., from a wall surface of the covered through-hole 41a) remains along the end of the thin (thin wall-like) portion. The residual thick (thick wall-like) portion will later be formed into the reflective portions 13. This cutting step is called the first cutting step of convenience.

Figure 10D:
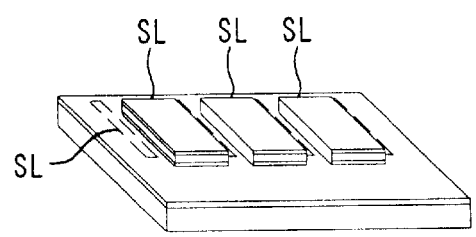

Next, parts of the thin (thin wall-like) portion represented with the dashed line of FIG. 10D and located along and between the piezoelectric/electrostrictive elements 14 are removed through laser beam processing to thereby form slits SL in the thin (thin wall-like) portion along the long sides of the piezoelectric/electrostrictive element 14.

Figure 11A:
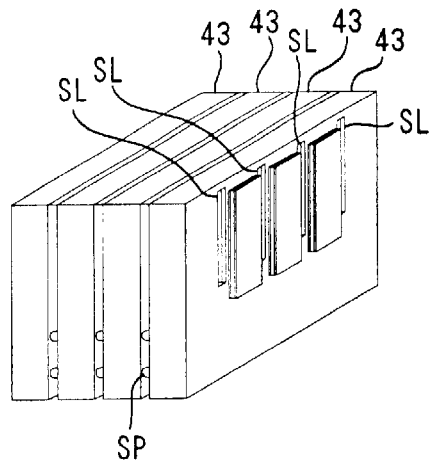
FIGS. 11A, 11B, and 11C are views showing steps of the second method for fabricating the piezoelectric/electrostrictive device of FIG. 5.

Next, as shown in FIGS. 9 and 11A, a plurality of unitary bodies 43 of ceramics having the slits SL formed therein are bonded together by means of adhesive while spacers SP are interposed therebetween. Notably, the unitary bodies 43 are bonded at thick (thick wall-like) portions which are to become the base portions 21 and on which terminals T (see FIG. 9) are formed. Subsequently, a removable filler, such as resin or wax, is filled into gaps between the unitary bodies 43 of ceramics, excluding portions of the gaps corresponding to the above-bonded portions. At this stage, the top surfaces of the bonded unitary bodies 43 of ceramic are polished.

Figure 11B:
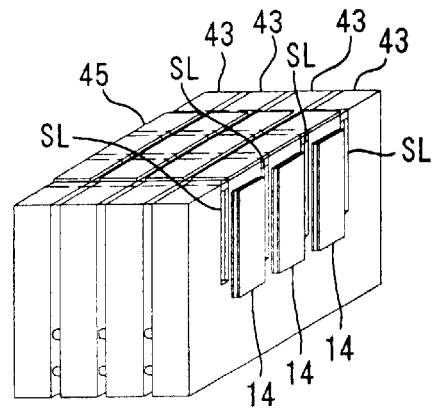

Next, as shown in FIG. 11B, the film 45 of a light-reflecting member is formed on the polished top surfaces through sputtering. Sputtering may be replaced by another thin-film formation process, such as vacuum deposition. In this case, the film 45 of a light-reflecting member may be formed merely on required portions of the top surfaces by use of a mask or formed on the entire top surfaces without use of the mask. In place of formation of the film 45, a bulk body of, for example, metal, which will be described later, may be bonded to the polished top surfaces.

Figure 11C:
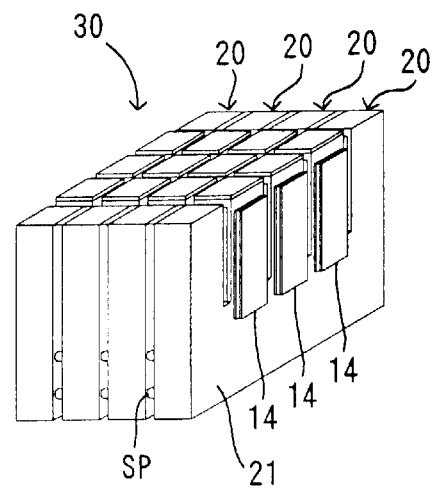

Next, the film 45 of a light-reflecting member and the residual thick (thick wall-like) portions formed as a result of cutting in the first cutting step are cut (cuts are formed in the film 45 and the residual portions) along the dashed lines of FIG. 11B by means of laser beam. The cuts are formed in such a manner as to be aligned with the slits SL (the cuts are formed along planes including the slits SL). Thus, the cuts are connected to the corresponding slits SL to thereby form the deformable portions 12. This laser beam cutting step is call the second cutting step of convenience. Finally, as shown in FIG. 11C, the filler, such as resin or wax, filling the gaps is removed by means of solvent. Thus, the piezoelectric/electrostrictive device 30 is completed.

The piezoelectric/electrostrictive device 30 fabricated by the present method corresponds to a plurality of piezoelectric/electrostrictive devices 20 of FIG. 4 arranged in columns. However, the height H6 shown in FIG. 4 is substantially equal to the height H1 of the base portion 11.

The second method of fabrication provides the following advantages in addition to those provided by the first method of fabrication. Since the thin (thin wall-like) portion is slit (removed to form slits) at positions along and between the piezoelectric/electrostrictive elements 14, the second cutting step is merely to cut the light-reflecting member 45 and the residual thick (thick wall-like) portions formed as a result of cutting in the first cutting step, along planes aligned with the slits SL. Thus, load (stress) imposed on the bonded unitary bodies 43 during the second cutting step can be reduced. Also, since a laser beam processing is used to form the slits SL and to carry out the second cutting step, load to be imposed on the bonded unitary bodies 43 during cutting can further be reduced, thereby preventing breakage of a device in process of fabrication.

Additionally, since the second method of fabrication does not involve machining of a piezoelectric/electrostrictive material (piezoelectric/electrostrictive layer), which is generally fragile, coming-off of ceramic grains or a like problem does not occur. Since a laser beam processing can narrow the width of processing to a great extent, the percentage of area where the light-reflecting member 13 is not present becomes very low. Accordingly, in application to, for example, an image display unit, the piezoelectric/electrostrictive device 30 having a plurality of reflective portions fabricated by the second method exhibits a high utilization rate of light from a light source.

The above first and second methods of fabrication are described while mentioning formation of the piezoelectric/electrostrictive element layer 44 on the unitary body (fired body) 43 of ceramics. However, the present invention is not limited thereto. For example, the piezoelectric/electrostrictive element layer 44 is formed on a green-sheet laminate (the ceramic green sheets 41 and 42 press-bonded into laminate), and the resulting unitary body is fired. Also, the piezoelectric/electrostrictive element 14 may be configured such that the first electrode 14b, the piezoelectric/electrostrictive layer 14a, and the second electrode 14c are arranged in a layered structure, and the second electrode 14c and the piezoelectric/electrostrictive layer 14a are alternatingly formed on the layered structure. In this case, the second electrodes 14c serve as the first electrodes 14a for the piezoelectric/electrostrictive layers 14a formed on the respective second electrodes 14c.

Fourth Embodiment

Figure 12:
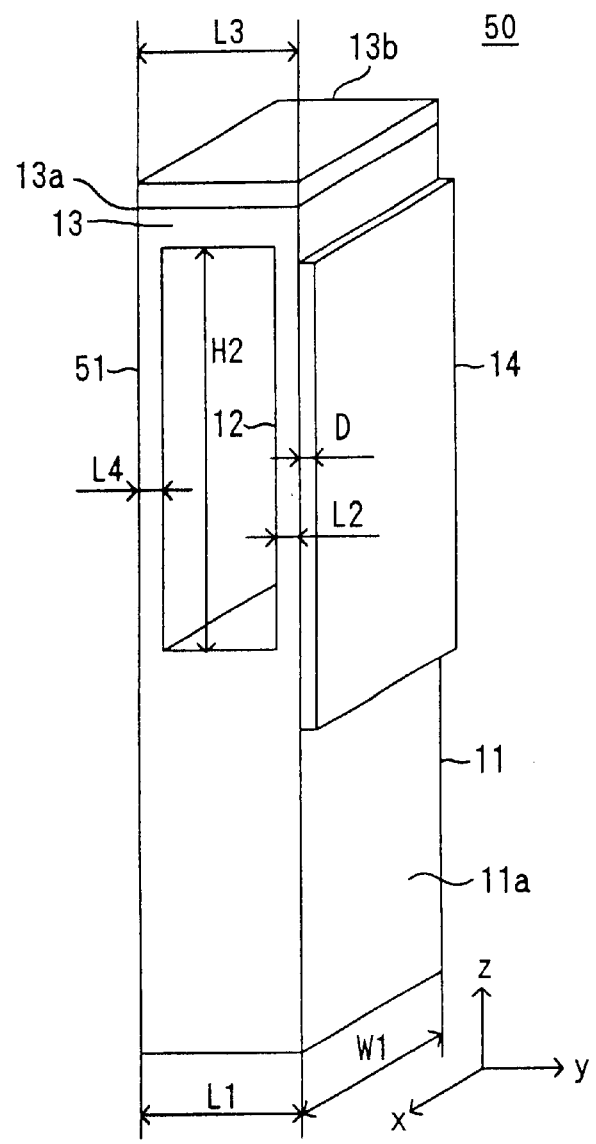
FIG. 12 is a schematic perspective view of a piezoelectric/electrostrictive device according to a fourth embodiment of the present invention.
Figure 13:
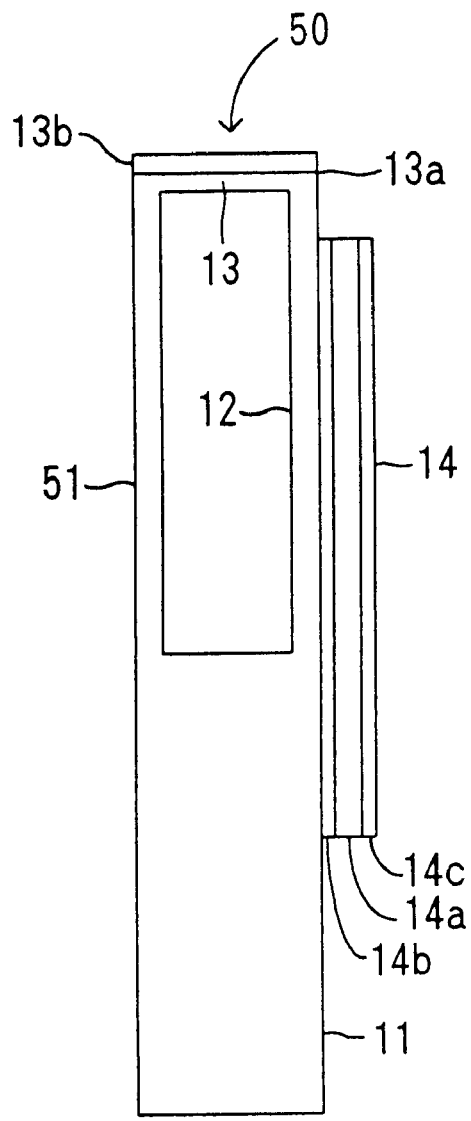
FIG. 13 is a front view of the piezoelectric/electrostrictive device of FIG. 12.

FIG. 12 is a schematic perspective view of a piezoelectric/electrostrictive device 50 according to a fourth embodiment of the present invention, and FIG. 13 is a front view of the device 50. The piezoelectric/electrostrictive device 50 is different from the piezoelectric/electrostrictive device 10 merely in that a holder portion 51 is provided. In FIG. 12, structural features similar to those of the piezoelectric/electrostrictive device 10 are denoted by common reference numerals, and the following description centers on the holder portion 51, which is a different feature from the piezoelectric/electrostrictive device 10.

The holder portion 51 is made of the same ceramics as that of the base portion 11 and extends from the base portion 11 in the z-axis while being formed integrally with the base portion 11. The holder portion 51 is a highly rigid thin-plate body having the width W1 equal to the width W1 of the deformable portion 12, a thickness L4 greater than the thickness L2 of the deformable portion 12, and the height H2 equal to the height H2 of the deformable portion 12 and assuming substantially the form of a rectangular parallelepiped. The holder portion 51 is connected to a side of the reflective portion 13 located in opposition to that of the reflective portion 13 supported by the deformable portion 12, to thereby hold (support) the reflective portion 13.

Next, the operation of the thus configured piezoelectric/electrostrictive device 50 will be described. When no voltage is applied to the first electrode 14b and the second electrode 14c (not shown in FIG. 12), the piezoelectric/electrostrictive device 50 is in the state shown in FIG. 12. When voltage is applied to the first electrode 14b and the second electrode 14c from an unillustrated drive circuit to thereby establish a predetermined electric potential difference therebetween, an electric field is imposed on the piezoelectric/electrostrictive layer 14a (not shown in FIG. 12) in the direction of thickness D. As a result, the piezoelectric/electrostrictive layer 14a contracts in a direction perpendicular to the electric field.

Figure 14:
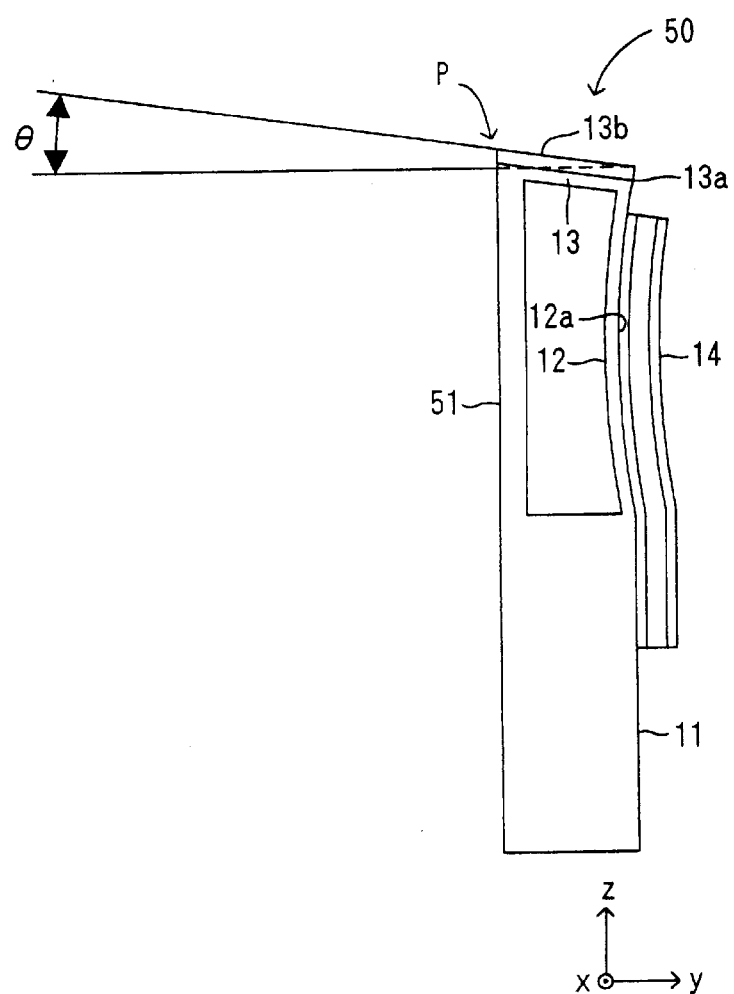
FIG. 14 is a front view of the piezoelectric/electrostrictive device of FIG. 12 as viewed when a deformable portion of the piezoelectric/electrostrictive device is displaced.

Since the first electrode 14b is tightly fixed to most of the deformable portion 12, the piezoelectric/electrostrictive layer 14a contracts at the second electrode 14c side while being prevented from contracting at the first electrode 14b side. Thus, as shown in FIG. 14, the deformable portion 12 is arcuately bent in a direction substantially perpendicular to the deformable plane 12a. Since the holder portion 51 is sufficiently rigid, the holder portion 51 remains undeformed even when the deformable portion 12 is deformed. As a result, the light-reflecting member 13b formed on the reflective portion 13 is tilted by an angle θ through pivoting about a boundary portion P between the holder portion 51 and the reflective portion 13. The piezoelectric/electrostrictive device 50 utilizes this action for changing the direction of reflection of light incident to the light-reflecting member 13b, thereby implementing the light modulation function.

The piezoelectric/electrostrictive device 50 according to the fourth embodiment not only yields effect similar to that yielded by the piezoelectric/electrostrictive device 10 according to the first embodiment, but also provides an advantage that the position of the light-reflecting member 13b does not move to a great extent, since the reflective surface of the light-reflecting member 13b tilts through pivoting about the boundary portion P. Thus, the axis of light to be reflected from the light-reflecting member 13b does not deviate from the light-reflecting member 13b.

Figure 15:
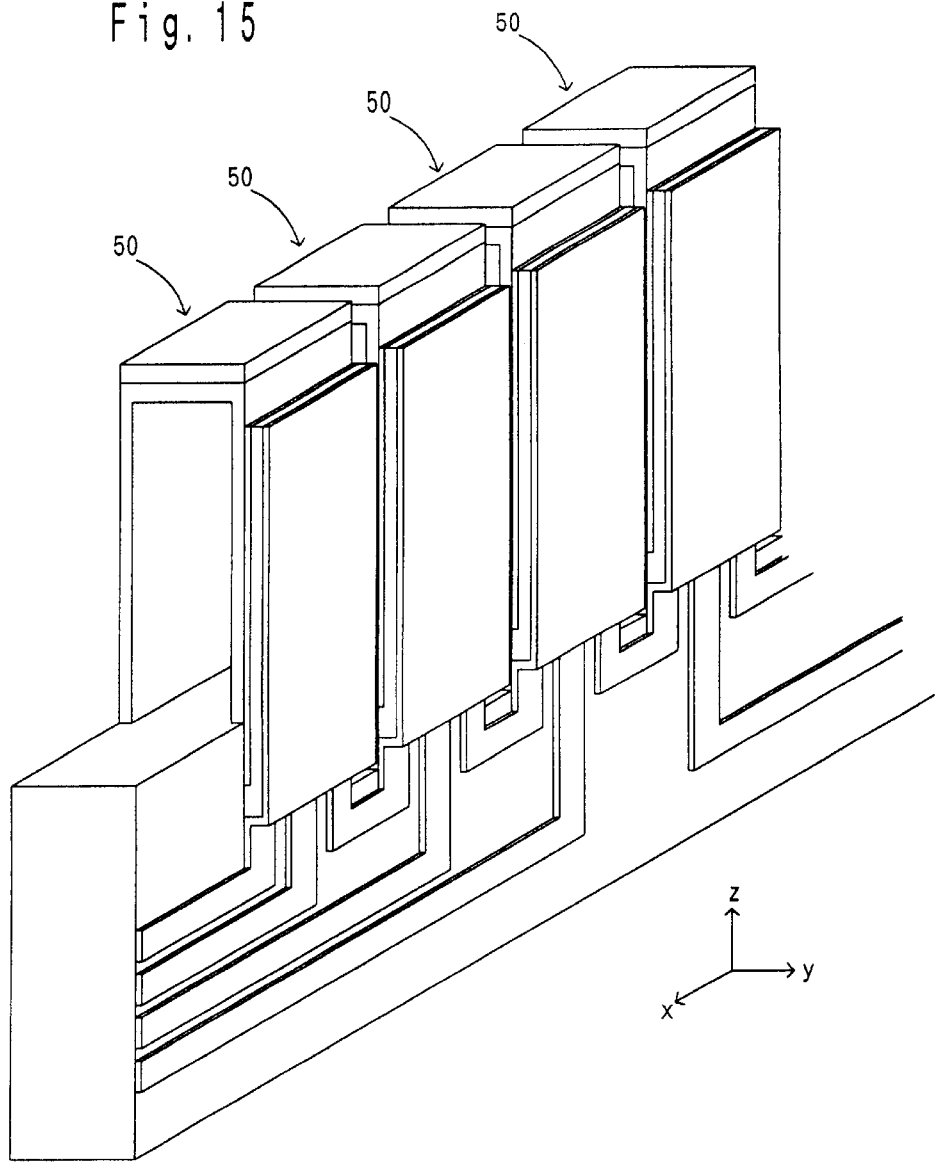
FIG. 15 is a schematic perspective view of a piezoelectric/electrostrictive device including a plurality of the piezoelectric/electrostrictive devices of FIG. 12 arranged linearly adjacent to one another.
Figure 16:
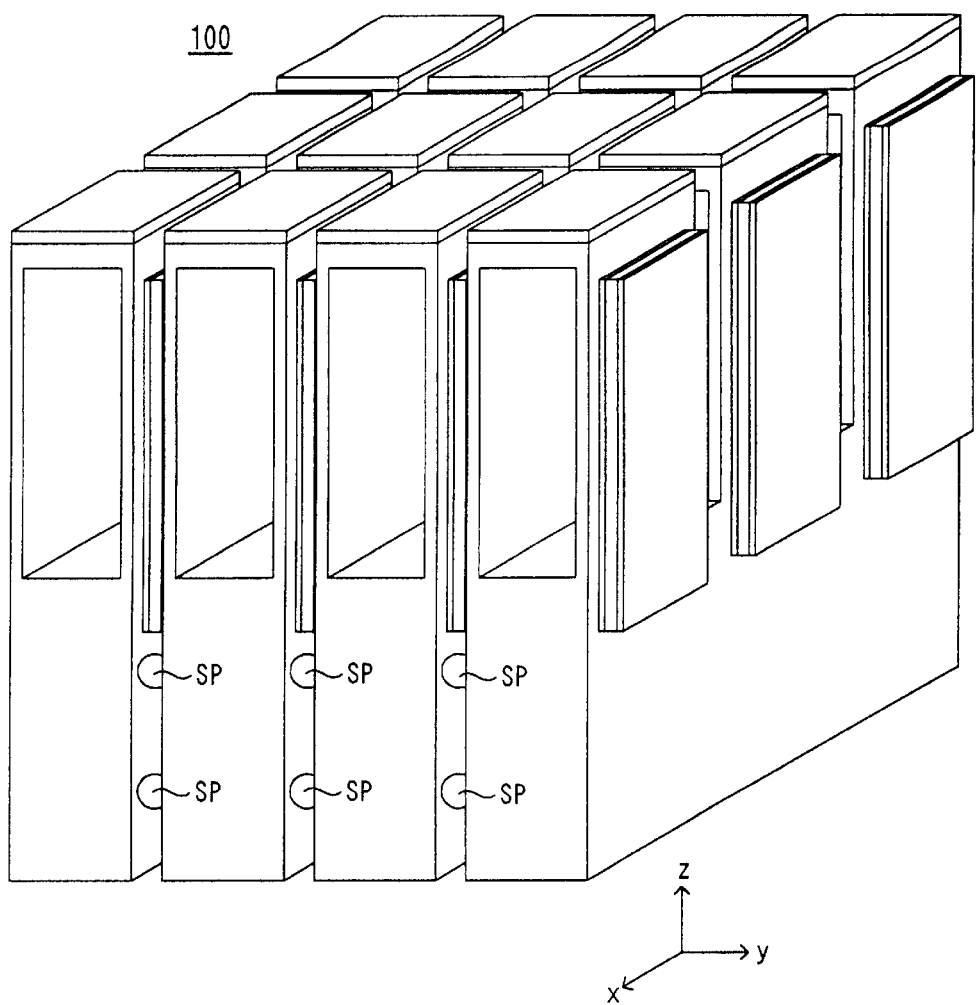
FIG. 16 is a schematic perspective view of a piezoelectric/electrostrictive device including a plurality of the piezoelectric/electrostrictive devices of FIG. 12 arranged in a matrix and adjacent to one another.

As in the manner shown in FIGS. 4 and 5 where a plurality of piezoelectric/electrostrictive devices 10 are arranged, a plurality of piezoelectric/electrostrictive devices 50 can be arranged linearly (see FIG. 15) or in a matrix (see FIG. 16), adjacent to one another, while the base portion 11 serves as a common base portion. Notably, in the case where a plurality of piezoelectric/electrostrictive devices 10 are arranged in a matrix, when the angle of reflection of a certain piezoelectric/electrostrictive device 10 is increased, interference with a neighboring piezoelectric/electrostrictive device 10 may arise. By contrast, the piezoelectric/electrostrictive device 50 does not involve such interference, since the reflective surface of the light-reflecting member 13b (i.e., the active plane 13a of the reflective portion 13) tilts through pivoting about the boundary portion P. Notably, in the case of a piezoelectric/electrostrictive device 100 shown in FIG. 16, the width of a piezoelectric/electrostrictive element is narrower than the width of a deformable portion.

Fifth Embodiment

Figure 17:
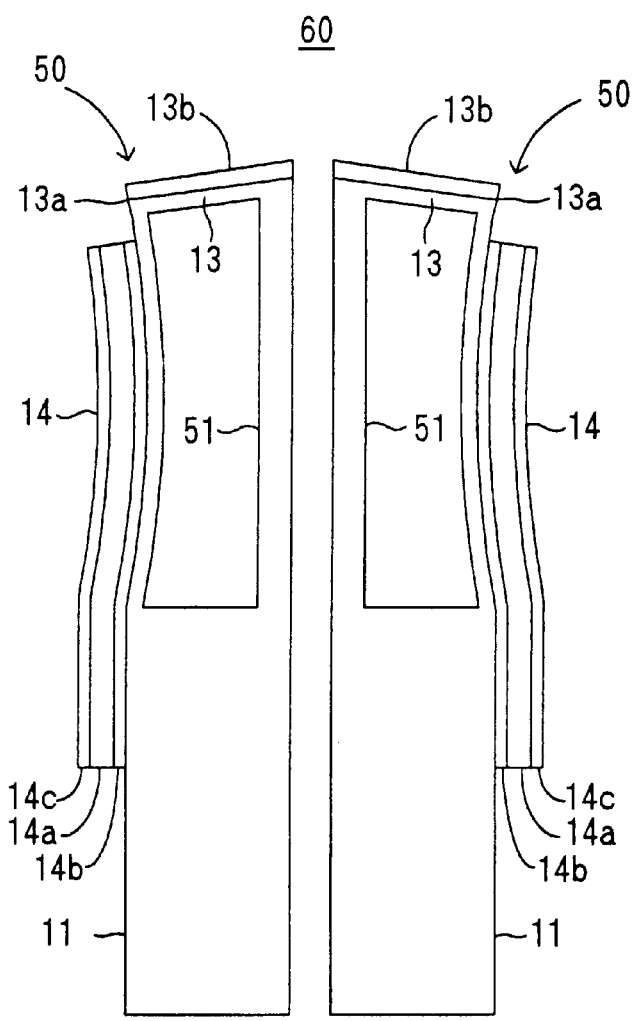
FIG. 17 is a front view of a piezoelectric/electrostrictive device according to a fifth embodiment of the present invention as viewed when deformable portions of the piezoelectric/electrostrictive device are displaced.

FIG. 17 is a front view showing a piezoelectric/electrostrictive device 60 according to a fifth embodiment of the present invention. The piezoelectric/electrostrictive device 60 includes two piezoelectric/electrostrictive devices 50 according to the fourth embodiment, which are arranged adjacent to each other such that the holder portions 51 face each other. FIG. 17 shows a state in which the same potential difference is imposed on the two piezoelectric/electrostrictive devices 50 between the first and second electrodes 14b and 14c. As seen from FIG. 17, the reflective portions 13 (light-reflecting members 13b) are tilted in reverse directions by an angle θ.

Sixth Embodiment

Figure 18:
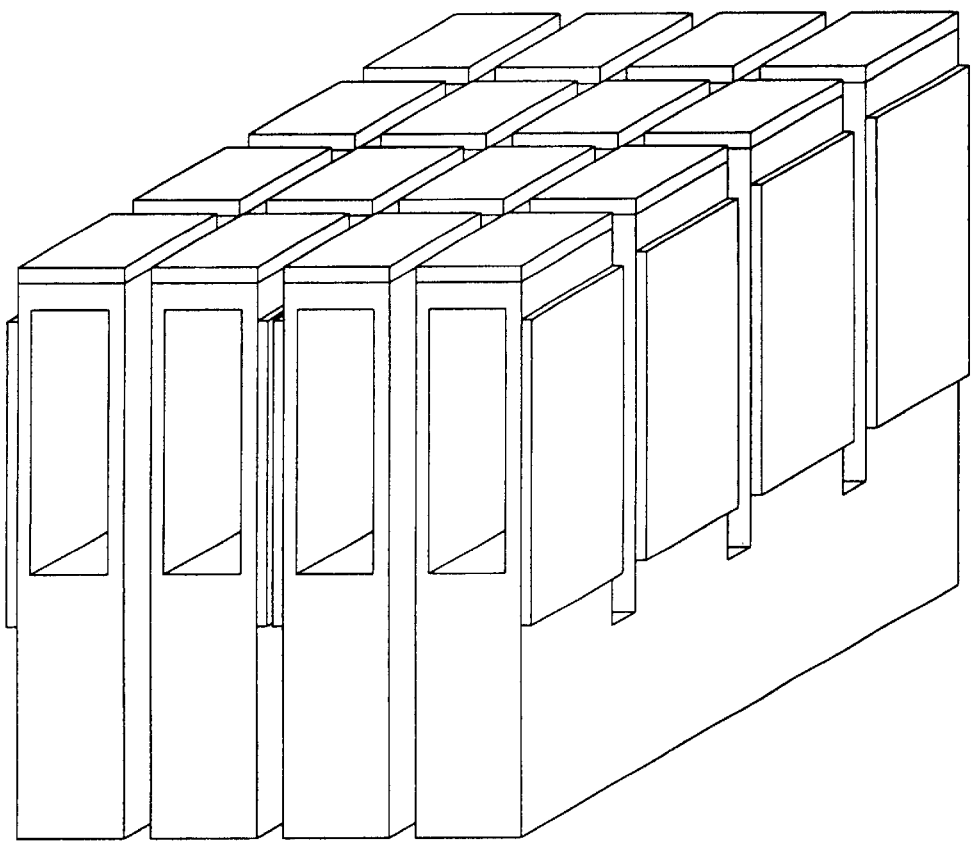
FIG. 18 is a schematic perspective view of a piezoelectric/electrostrictive device according to a sixth embodiment of the present invention.

FIG. 18 is a perspective view showing a piezoelectric/electrostrictive device 70 according to a sixth embodiment of the present invention. The piezoelectric/electrostrictive device 70 includes a plurality of piezoelectric/electrostrictive devices 60 of the fifth embodiment arranged in a matrix while the base portion 11 serves as a common base portion in each column as in the case of the third embodiment shown in FIG. 5. The piezoelectric/electrostrictive devices 60 and 70 according to the fifth and sixth embodiments can change the reflection angle of the same light incident to the light-reflecting members 13b of two adjacent functional elements (in the sixth embodiment, two functional elements adjacent to each other along a row (direction of y-axis) in the matrix), thereby changing the reflection angle of the incident light over a range of ±θ. Note that since the incident light is divided by the two functional elements, the intensity of light is halved after reflection.

Seventh Embodiment

FIG. 19 is a front view showing a piezoelectric/electrostrictive device 80 according to a seventh embodiment. The piezoelectric/electrostrictive device 80 structurally differs from the piezoelectric/electrostrictive device 10 of the first embodiment in that a pair of deformable portions 12R and 12L of the same shape (the same shape as that of the deformable portion 12 of the piezoelectric/electrostrictive device 10) extend in opposition to each other from opposite planes of the base portion 11; a pair of piezoelectric/electrostrictive elements 14R and 14L are formed on the corresponding paired deformable portions 12R and 12L; and the paired deformable portions 12R and 12L support opposite ends of the reflective portion 13. In FIG. 18, structural features similar to those of the piezoelectric/electrostrictive device 10 are denoted by common reference numerals.

Figure 20A:
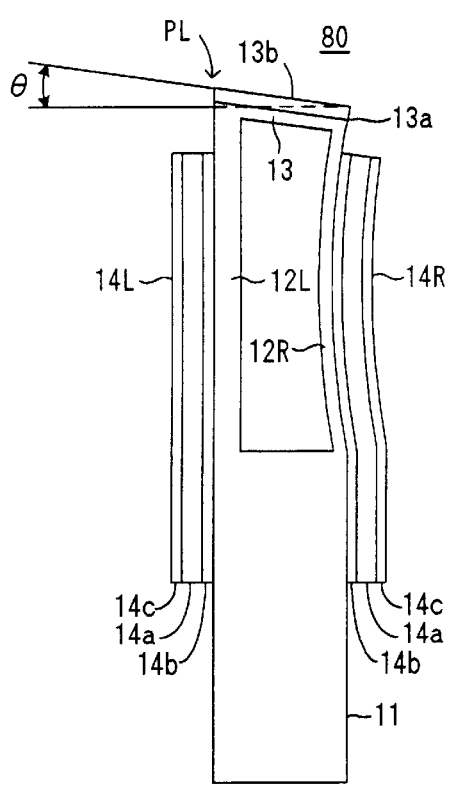
FIG. 20A is a front view of the piezoelectric/electrostrictive device of FIG. 19 as viewed when a right-hand deformable portion of the piezoelectric/electrostrictive device is displaced.

Next, the operation of the piezoelectric/electrostrictive device 80 will be described with reference to FIGS. 19, 20A, and 20B. When no voltage is applied to the first electrode 14b and the second electrode 14c, the piezoelectric/electrostrictive device 80 is in the state shown in FIG. 19. As shown in FIG. 20A, when an unillustrated drive circuit establishes a predetermined electric potential difference between the first electrode 14b and the second electrode 14c of the right-hand piezoelectric/electrostrictive element 14R, the right-hand piezoelectric/electrostrictive element 14R operates, causing the right-hand deformable portion 12R to be arcuately bent. At this time, the left-hand deformable portion 12L is bent to a mere slight extent. As a result, the light-reflecting member 13b formed on the reflective portion 13 is tilted by an angle θ through pivoting about a portion in the vicinity of a boundary portion PL between the left-hand deformable portion 12L and the reflective portion 13.

Figure 20B:
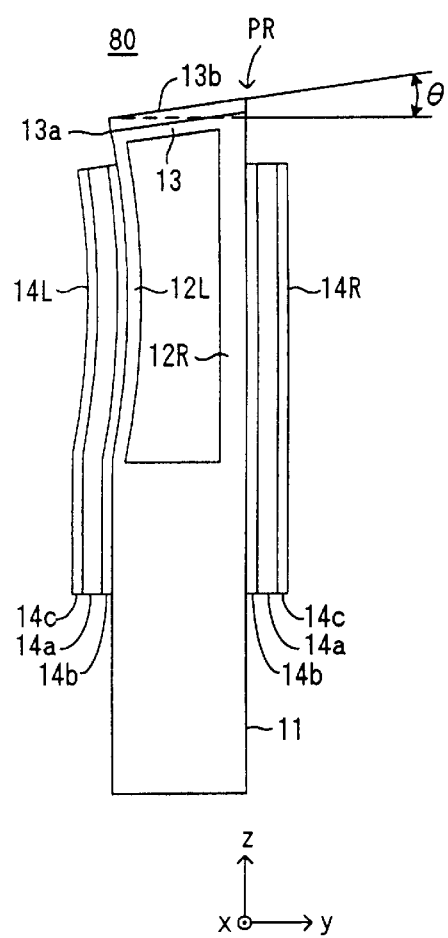
FIG. 20B is a front view of the piezoelectric/electrostrictive device of FIG. 19 as viewed when a left-hand deformable portion of the piezoelectric/electrostrictive device is displaced.

As shown in FIG. 20B, when the unillustrated drive circuit establishes a predetermined electric potential difference between the first electrode 14b and the second electrode 14c of the left-hand piezoelectric/electrostrictive element 14L, the left-hand piezoelectric/electrostrictive element 14L operates, causing the left-hand deformable portion 12L to be arcuately bent. At this time, the right-hand deformable portion 12R is bent to a mere slight extent. As a result, the light-reflecting member 13b formed on the reflective portion 13 is tilted by an angle θ through pivoting about a portion in the vicinity of a boundary portion PR between the right-hand deformable portion 12R and the reflective portion 13.

Accordingly, the piezoelectric/electrostrictive device 80 according to the seventh embodiment allows a change in the angle of the light-reflecting member 13b over a range of ±θ with respect to the horizontal with substantially no movement of the position of the light-reflecting member 13b, and thus can meet a wide range of needs.

Eighth Embodiment

Figure 21:
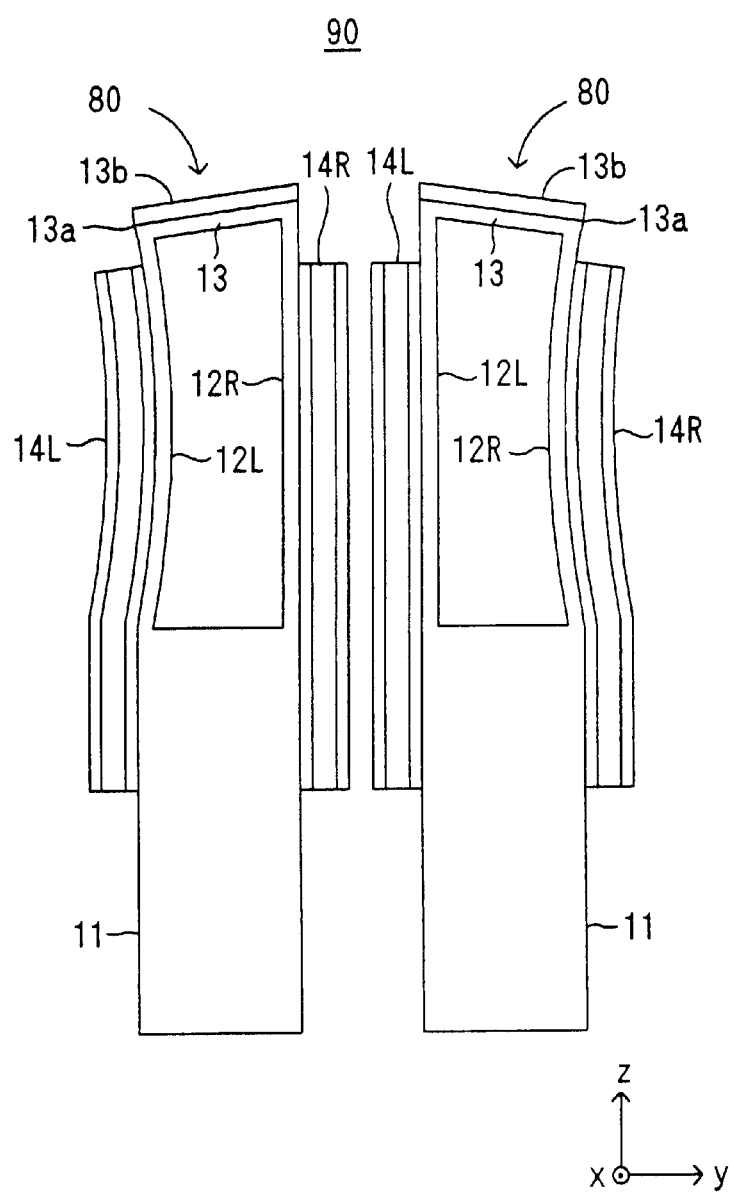
FIG. 21 is a front view of a piezoelectric/electrostrictive device according to an eighth embodiment of the present invention as viewed when a right-hand deformable portion of a right-hand functional element and a left-hand deformable portion of a left-hand functional element are displaced.

FIG. 21 is a front view showing a piezoelectric/electrostrictive device 90 according to an eighth embodiment of the present invention. The piezoelectric/electrostrictive device 90 includes two piezoelectric/electrostrictive devices 80 according to the seventh embodiment, which are arranged adjacent to each other such that the left-hand piezoelectric/electrostrictive element 14L of one piezoelectric/electrostrictive device 80 (the right-hand one in FIG. 21) and the right-hand piezoelectric/electrostrictive element 14R of the other piezoelectric/electrostrictive device 80 (the left-hand one in FIG. 21) face each other. FIG. 21 shows a state in which the right-hand piezoelectric/electrostrictive element 14R of the right-hand piezoelectric/electrostrictive device 80 is operated to thereby cause displacement of the right-hand deformable portion 12R, and the left-hand piezoelectric/electrostrictive element 14L of the left-hand piezoelectric/electrostrictive device 80 is operated to thereby cause displacement of the left-hand deformable portion 12L.

Ninth Embodiment

Figure 22:
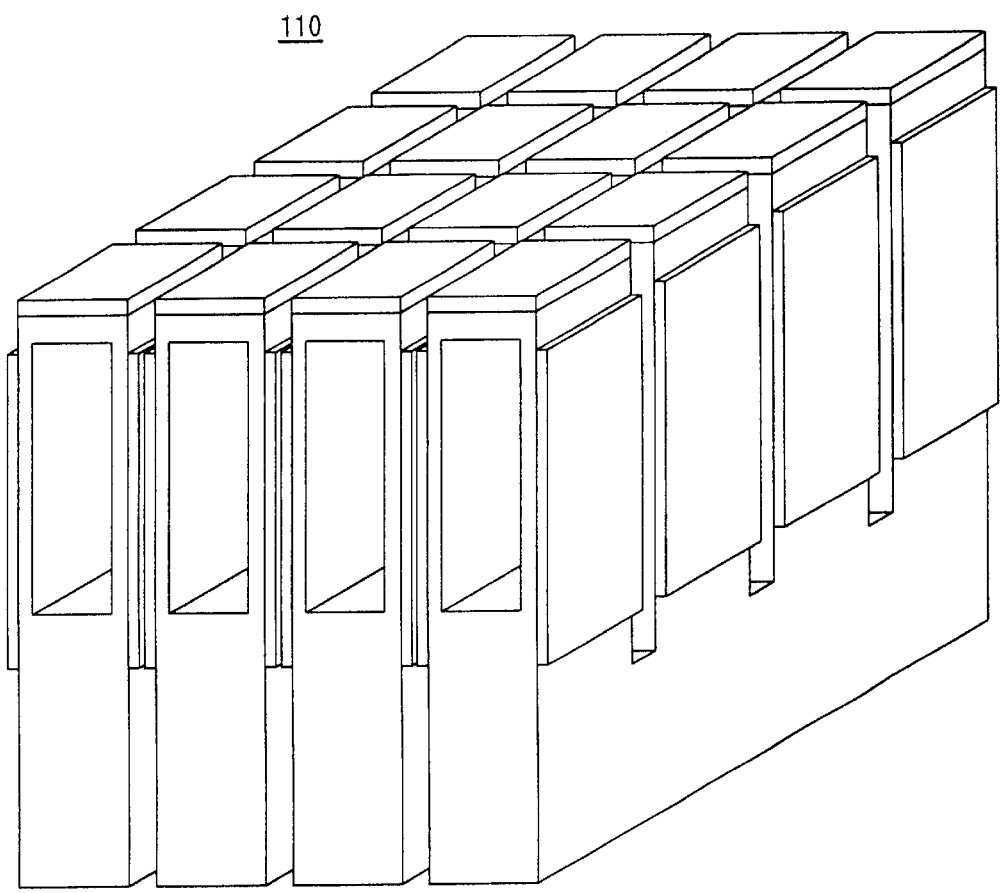
FIG. 22 is a schematic perspective view of a piezoelectric/electrostrictive device according to a ninth embodiment of the present invention.

FIG. 22 is a perspective view showing a piezoelectric/electrostrictive device 110 according to a ninth embodiment of the present invention. The piezoelectric/electrostrictive device 110 includes a plurality of piezoelectric/electrostrictive devices 90 of the eighth embodiment arranged in a matrix while the base portion 11 serves as a common base portion in each column. According to the present embodiment, a plurality of piezoelectric/electrostrictive devices each extending in the direction of column with the base portion 11 serving as a common base portion are arranged in the direction of row and fixedly attached to, for example, an unillustrated substrate through bonding or like means.

According to the fifth and sixth embodiments, two functional elements (two light-reflecting members) are used to reflect incident light over a range of ±θ; as a result, the intensity of light is halved after reflection. By contrast, in the case of the piezoelectric/electrostrictive devices 90 and 110 according to the eighth and ninth embodiments, a single functional element (a single light-reflecting member) provides a reflection angle of ±θ, the intensity of light is not halved after reflection. Thus, light modulation can be efficiently performed.

A piezoelectric/electrostrictive device having the holder portion 51 as represented by the fourth embodiment or a piezoelectric/electrostrictive device having two opposed deformable portions (a pair of deformable portions) as represented by the seventh embodiment can be fabricated substantially according to the first or second method of fabrication, except that the ceramic green sheet 41 which is to be formed into a base portion and a reflective portion is sandwiched between the ceramic green sheet 42 which is to be formed into a deformable portion and a ceramic green sheet which is to be formed into a holder portion or an opposite deformable portion.

Tenth Embodiment

Figure 23:
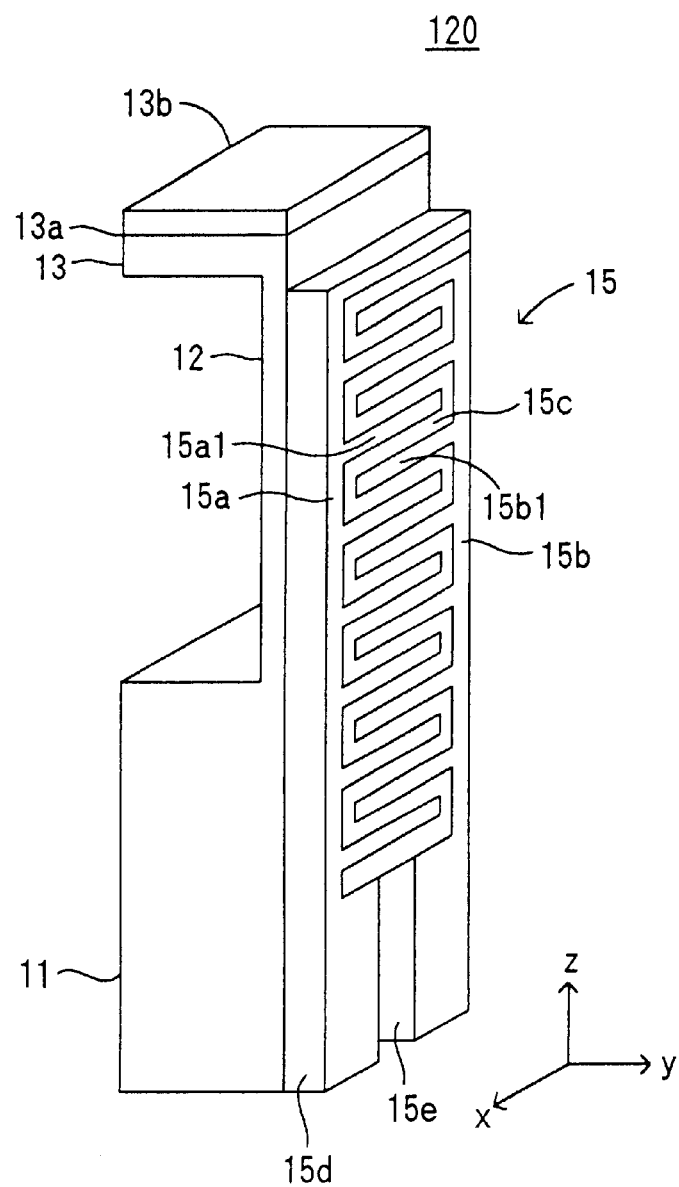
FIG. 23 is a schematic perspective view of a piezoelectric/electrostrictive device according to a tenth embodiment of the present invention.

FIG. 23 is a perspective view showing a piezoelectric/electrostrictive device 120 according to a tenth embodiment of the present invention. The piezoelectric/electrostrictive device 120 differs from the piezoelectric/electrostrictive device 10 of the first embodiment merely in that the piezoelectric/electrostrictive element 14 is replaced with a piezoelectric/electrostrictive element 15 including comb-type electrodes. Accordingly, in FIG. 23, structural features similar to those of the piezoelectric/electrostrictive device 10 are denoted by common reference numerals. The following description centers on the piezoelectric/electrostrictive element 15, which is a structural feature not employed in the first embodiment.

The piezoelectric/electrostrictive element 15 includes a pair of comb-type electrodes 15a and 15b disposed in opposition to each other and a piezoelectric/electrostrictive layer 15c embedded between the electrodes 15a and 15b. The piezoelectric/electrostrictive element 15 is tightly fixed to the deformable portion 12 and the base portion 11. Extending downward (in the negative direction of the z-axis) from the paired comb-type electrodes 15a and 15b, terminals 15d and 15e for application of voltage are formed on the base portion 11. The comb-type electrodes 15a and 15b and the terminals 15d and 15e are made of, for example, platinum.

Next, the operation of the thus configured piezoelectric/electrostrictive device 120 will be described. When no voltage is applied to the comb-type electrodes 15a and 15b, the piezoelectric/electrostrictive device 120 is in the state shown in FIG. 23. When an unillustrated drive circuit establishes a predetermined electric potential difference between the comb-type electrodes 15a and 15b, the opposed electrode teeth 15a1 and 15b1 impose an electric field on the piezoelectric/electrostrictive layer 15c in the direction of the z-axis. Accordingly, the piezoelectric/electrostrictive layer 15c expands in the direction of the z-axis. However, a portion of the piezoelectric/electrostrictive layer 15c at the deformable portion 12 is prevented from expanding, since the portion of piezoelectric/electrostrictive layer 15c is fixed with the deformable portion 12. As a result, the deformable portion 12 is arcuately bent in the negative direction of the y-axis, causing a change in the angle of the light-reflecting member 13b formed on the reflective portion 13. The piezoelectric/electrostrictive device 120 utilizes this action for changing the direction of reflection of light incident to the light-reflecting member 13b, thereby implementing the light modulation function.

Figure 24:
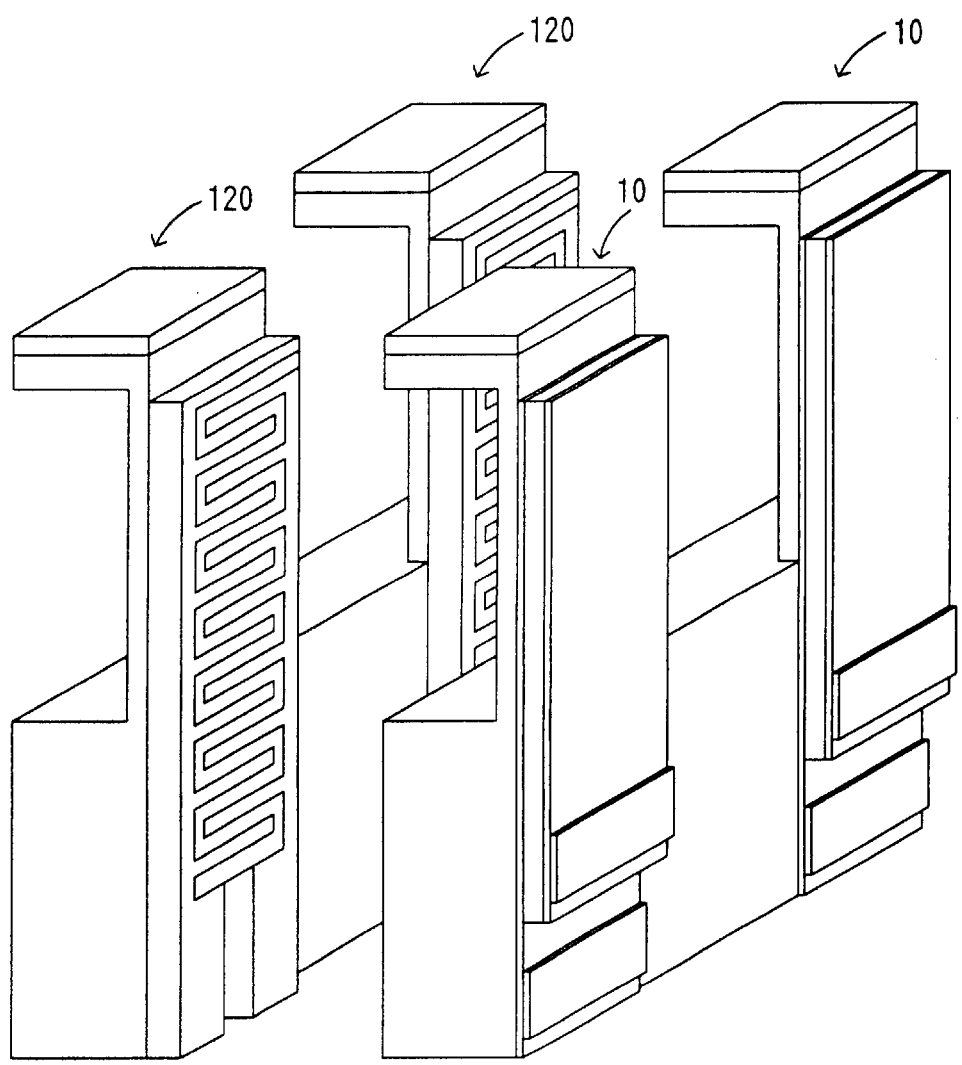
FIG. 24 is a schematic perspective view showing an application example of the piezoelectric/electrostrictive device of FIG. 23.

As in the manner shown in FIGS. 4 and 5 where a plurality of piezoelectric/electrostrictive devices 10 are arranged, a plurality of piezoelectric/electrostrictive devices 120 can be arranged linearly or in a matrix and adjacent to one another while the base portion 11 serves as a common base portion. Also, as shown in FIG. 24, the piezoelectric/electrostrictive device 120 can be used in combination with the piezoelectric/electrostrictive device 10, to thereby yield effects similar to those yielded by the fifth and sixth embodiments.

In place of embedding of a piezoelectric/electrostrictive material between paired comb-type electrodes as in the case of the piezoelectric/electrostrictive device 120, a piezoelectric/electrostrictive layer may be directly formed on the deformable portion 12 while a pair of comb-type electrodes are formed on the piezoelectric/electrostrictive layer. Alternatively, a pair of comb-type electrodes may be form on the deformable portion 12 while a piezoelectric/electrostrictive layer is formed on the paired comb-type electrodes.

Materials and Dimensions Employed in the Embodiments

Examples of materials and dimensions of a base portion, a light-reflecting member, a piezoelectric/electrostrictive element, and an electrode employed in the above embodiments will next be described. The conventional DMD and AMA limit material for components to that suited for semiconductor fabrication process. By contrast, the piezoelectric/electrostrictive devices of the above embodiments allow optimization of material from a functional point of view for each of a base portion, a deformable portion, and a reflective portion.

Material for the base portions 11 and 21 and the reflective portion 13 is not particularly limited so long as sufficient rigidity is provided. Examples of such material include ceramics and metal. Specific examples of ceramics include ceramic material which contains predominantly zirconia, such as stabilized zirconia or partially stabilized zirconia, alumina, magnesia, silicon nitride, aluminum nitride, or titanium oxide. Because of high mechanical strength and toughness, ceramic material which contains predominantly zirconia, particularly stabilized zirconia or partially stabilized zirconia, is most preferred. Specific examples of metal include stainless steel and nickel steel. When the reflective portion 13 is made of metal, the reflective portion 13 itself may serve as a light-reflecting member. This may be interpreted such that a reflective member made of the same metal as that of which the reflective portion 13 is made is disposed on the reflective portion 13.

The thickness L1 of the base portion 11 and the depth L3 of the reflective portion 13 are preferably 30 μm to 2000 μm. Preferably, the width W1 of the base portion 11 and the reflective portion 13 is 30 μm to 2000 μm. The height (thickness) H3 of the reflective portion 13 is determined so as to yield such rigidity that the reflective portion 13 itself can maintain the flatness of the active plane 13a (accordingly, the reflective surface of the light-reflecting member 13b). Specifically, a height H3 of 30 μm to 500 μm is preferred. Notably, the thickness L1 of the base portion 11 is not necessarily equal to the depth L3 of the reflective portion 13. The thickness L1 of the base portion 11 may be greater than the depth L3 of the reflective portion 13.

As mentioned previously, the deformable portion 12 is bent as a result of operation of the piezoelectric/electrostrictive element 14. Material for the deformable portion 12 is not particularly limited so long as the deformable portion 12 becomes flexible and has such mechanical strength that the deformable portion 12 does not break when bent. The material may be selected as appropriate in view of responsiveness and operability of the reflective portion 13.

Material for the deformable portion 12 can be ceramics of which the base portion 11 is made. Ceramic material which contains dominantly zirconia, particularly stabilized zirconia or partially stabilized zirconia, is preferred since high mechanical strength and toughness can be exhibited at thin wall and because of low reactivity with a piezoelectric/electrostrictive layer and electrode material. Preferably, the deformable portion 12 and the base portion 11 are made of the same material since the reliability of a joined portion is improved; the strength of the piezoelectric/electrostrictive device 10 is enhanced; and the fabrication process can be simplified.

The deformable portion 12 can be made of metal. In this case, preferable ferrous metals include various kinds of stainless steel and various kinds of spring steel; and preferable non-ferrous metals include beryllium copper, phosphor bronze, nickel, and nickel-iron alloy.

Preferably, stabilized zirconia or partially stabilized zirconia used preferably as material for, for example, the base portion 11 and the deformable portion 12 contains the following compound for stabilization or partial stabilization. Compounds for stabilizing or partially stabilizing zirconia are yttrium oxide, ytterbium oxide, cerium oxide, calcium oxide, and magnesium oxide. At least one of the compounds is added for partially or fully stabilizing zirconia. The compounds may be added singly or in combination.

For stabilization or partial stabilization of zirconia, yttrium oxide or ytterbium oxide is added in an amount of 1 mol % to 30 mol %, preferably 1.5 mol % to 10 mol %; cerium oxide is added in an amount of 6 mol % to 50 mol %; and calcium oxide or magnesium oxide is added in an amount of 5 mol % to 40 mol %, preferably 5 mol % to 20 mol %. Particularly, using yttrium oxide as a stabilizer is preferred. In this case, yttrium oxide is added in an amount of 1.5 mol % to 10 mol %, preferably 2 mol % to 4 mol %. Also, applicable additives, such as sintering aid, include alumina, silica, and transition-metal oxide. Such additives can be added in a total amount of 0.05 wt. % to 20 wt. %. When the piezoelectric/electrostrictive element 14 (piezoelectric/electrostrictive layer 14a) is to be formed through film formation process followed by firing for integration, addition of, for example, alumina, magnesia, and transition-metal oxide is preferred.

In order to obtain sufficient mechanical strength and a stabilized crystal phase, the average crystal grain size of zirconia is 0.05 $\mu$m to 3 $\mu$m, preferably 0.05 $\mu$m to 1 $\mu$m.

Piezoelectric ceramics can favorably be used as materials for the piezoelectric/electrostrictive element 14 (piezoelectric/electrostrictive layer 14a). However, electrostrictive ceramics, ferroelectric ceramics, and antiferroelectric ceramics can also be used. Since image display units, printing units, exposure units, optical switches, among others employ the piezoelectric/electrostrictive devices of the above embodiments in order to utilize the function of the devices that, through operation of the piezoelectric/electrostrictive element 14, the light reflection angle of the active plane 13a of the reflective portion 13 (i.e., the light reflection angle of the reflective surface of the light-reflecting member 13b) is changed at high accuracy, linearity between the deformable portion 12 and drive voltage must be favorably maintained. Therefore, the piezoelectric/electrostrictive element 14 is preferably made of material having low strain hysteresis (accordingly, material having a coercive electric field of not greater than 10 kV/mm).

More specifically, materials for a piezoelectric/electrostrictive element can be ceramics which contain, singly or in combination, lead zirconate, lead titanate, lead zinc niobate, lead manganese niobate, lead antimony stannate, lead manganese tungstate, lead cobalt niobate, barium titanate, bismuth sodium titanate, sodium potassium niobate, and bismuth strontium tantalate. Materials for an electrostrictive element can be ceramics which contain, singly or in combination, lead magnesium niobate and lead nickel niobate.

Among these ceramics, ceramics which contain a predominant amount of lead zirconate, lead titanate, and lead magnesium niobate or a predominant amount of bismuth sodium titanate are preferred as materials for the piezoelectric/electrostrictive layer 14a, since the piezoelectric/electrostrictive element 14 attains high electromechanical coupling factor, high piezoelectric constant, low reactivity with the deformable portion 12 and the base portion 11 during sintering of the piezoelectric/electrostrictive layer 14a, and stable composition.

Furthermore, the above ceramics which further contain, singly or in combination, compounds such oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and tin may be used as materials for the piezoelectric/electrostrictive element 14.

For example, in some cases, through incorporation of lanthanum or strontium into lead zirconate, lead titanate, or lead magnesium niobate, which are main components of the ceramics, a coercive electric field and piezoelectric characteristics can be adjusted.

Notably, addition of an easily vitrifiable material, such as silica, is desirably avoided. Such materials are likely to react with a piezoelectric/electrostrictive material during heat treatment of a piezoelectric/electrostrictive layer, causing the material composition to vary with a resultant deterioration in piezoelectric characteristics.

The first and second electrodes 14b and 14c, the comb-type electrodes 15a and 15b, and wiring and terminals, which will be described, are preferably made of metal which is solid at room temperature and exhibits excellent conductivity. Examples of such metal include aluminum, titanium, chromium, iron, cobalt, nickel, copper, zinc, niobium, molybdenum, ruthenium, palladium, rhodium, silver, tin, tantalum, tungsten, iridium, platinum, gold, and lead as well as alloys thereof. Cermet obtained through dispersion of the same material as that of the piezoelectric/electrostrictive element 14 or the deformable portion 12 into any of the above metals may also be usable.

Material for the first and second electrodes 14b and 14c, the comb-type electrodes 15e and 15f, and wiring and terminals, which will be described later, is determined depending on a method for forming the piezoelectric/electrostrictive element 14. For example, in the case of forming the piezoelectric/electrostrictive element 14 by the steps of forming the first electrode 14b on the deformable portion 12 and then forming the piezoelectric/electrostrictive layer 14a on the first electrode 14b through sintering, the first electrode 14b must be made of metal of high melting point, such as platinum, palladium, platinum-palladium alloy, or silver-palladium alloy, which is not modified at a firing temperature of the piezoelectric/electrostrictive layer 14a. By contrast, since the second electrode 14c, which is formed on the fired piezoelectric/electrostrictive layer 14a, can be formed at low temperature, the second electrode 14c can be made of metal of low melting point, such as aluminum, gold, or silver.

When the first and second electrodes 14b and 14c are too thick, displacement of the deformable portion 12 effected through operation of the piezoelectric/electrostrictive element 14 is impaired. Therefore, in particular, the second electrode 14c, which is formed after the piezoelectric/electrostrictive layer 14a is fired, is preferably formed of an organic metal paste enabling formation of a fine, thin film through firing. Examples of such paste include gold resinate paste, platinum resinate paste, and silver resinate paste.

The thickness L2 of the deformable portion 12 is preferably 4 $\mu$m to 100 $\mu$m. The total thickness of the deformable portion 12 and the piezoelectric/electrostrictive element 14 (L2+D) is preferably 7 µm to 400 µm. The thickness of each of the first and second electrodes 14b and 14c is preferably 0.05 µm to 50 µm, more preferably 0.1 µm to 5 µm. The thickness of the piezoelectric/electrostrictive layer 14a is preferably 3 µm to 200 µm. The width W1 of the deformable portion 12 is preferably 30 µm to 2000 µm.

Material for the light-reflecting member 13b is not particularly limited so long as the efficiency of light reflection is high. Examples of such material include metals, alloys, glass, ceramics, rubber, and organic resins. These materials may be used singly or in combination. Examples of such metals and examples of metal components of such alloys include aluminum, titanium, chromium, iron, cobalt, nickel, copper, tin, tantalum, tungsten, iridium, platinum, gold, and lead.

The light-reflecting member 13b is disposed on the active plane 13a through, for example, bonding of a bulk body made of any of the above materials onto the active plane 13a, formation of a thin film made of any of the above materials on the active plane 13a, or lamination of a thin film made of some of the above materials on the active plane 13a. Formation of the single-layer thin film or lamination of the thin film is preferable to bonding of the bulk body since the formed light-reflecting members 13b become uniform in tilting angle and flatness of the reflective surface.

Examples of Electrode Wiring (Terminals T) Configuration

Examples of configuration of wiring to (examples of configuration of terminals T for) the first and second electrodes 14b and 14c in the above embodiments will next be described with reference to FIGS. 25 to 30. Notably, examples of electrode wiring shown in FIGS. 25 to 29 are of the piezoelectric/electrostrictive device 20 of the second embodiment but are also applicable to other embodiments.

Figure 25:
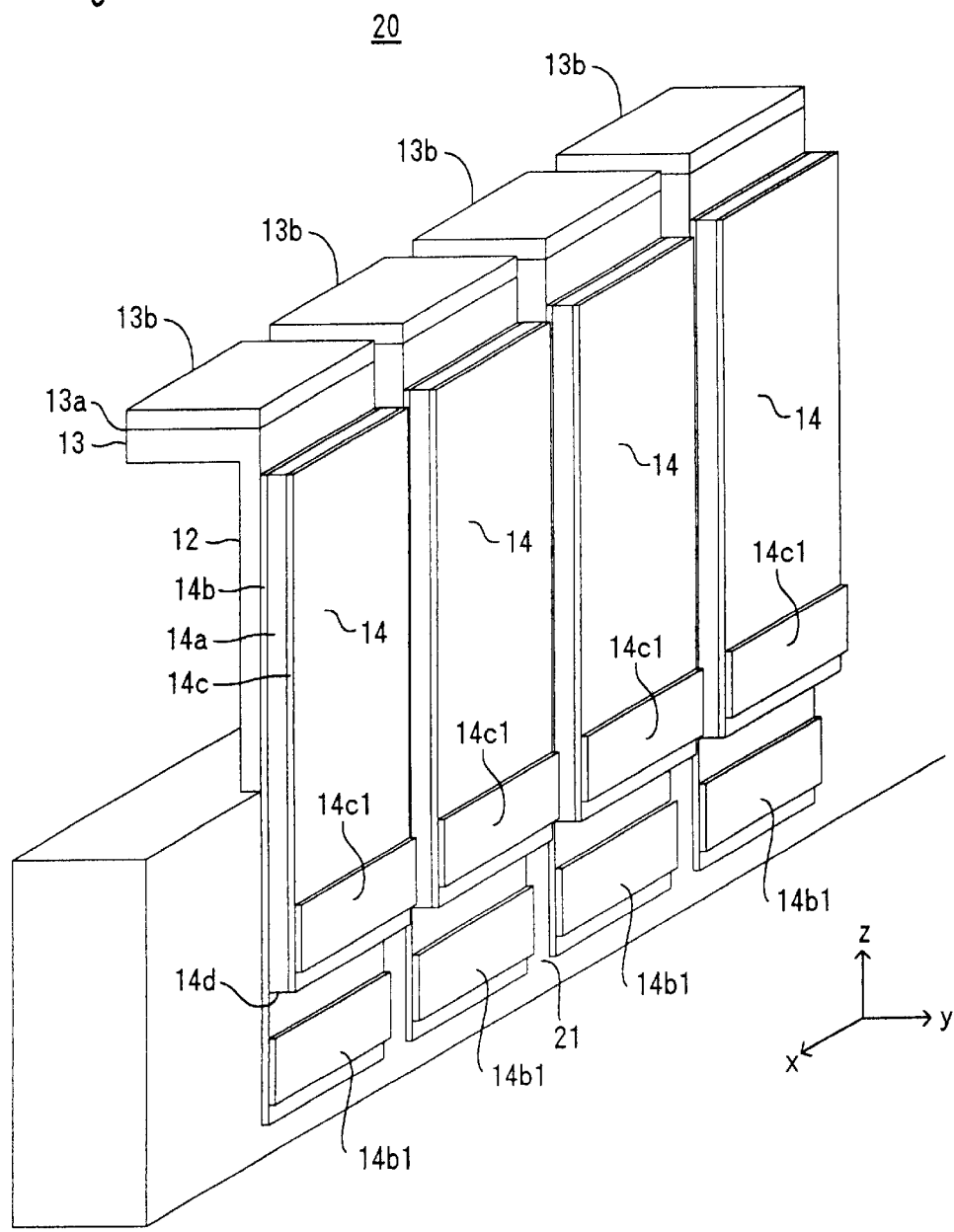
FIG. 25 is a perspective view of the piezoelectric/electrostrictive device of FIG. 4, showing a wiring example for the piezoelectric/electrostrictive device.

In the piezoelectric/electrostrictive device 20 shown in FIG. 25, a portion of the first electrode 14b formed on the base portion 21 extends downward (in the negative direction of the z-axis) beyond the lower end 14d of the piezoelectric/electrostrictive layer 14a. An electrode pad 14b1, which is in the form of a rectangular thin plate and is made of conductive metal, is formed on the extending portion of the first electrode 14b. An electrode pad 14c1, which is in the form of a rectangular thin plate and is made of conductive metal, is formed on the second electrode 14c in the vicinity of the lower end thereof. Unillustrated metal wires (for example, gold wires) are bonded to the corresponding electrode pads 14b1 and 14c1. The metal wires are connected to an unillustrated drive circuit. This configuration enables the piezoelectric/electrostrictive elements 14 to operate independently of one another; i.e., the deformable portions 12 on which the piezoelectric/electrostrictive elements 14 are formed are displaced independently of one another. Thus, the active planes 13a of the reflective portions 13 (i.e., the reflective surfaces of the light-reflecting members 13b) can be changed in angle independently of one another. Connection to the drive circuit may be established by means of, for example, a flexible printed circuit board (FPC) or flexible flat cables (FFC).

Figure 26:
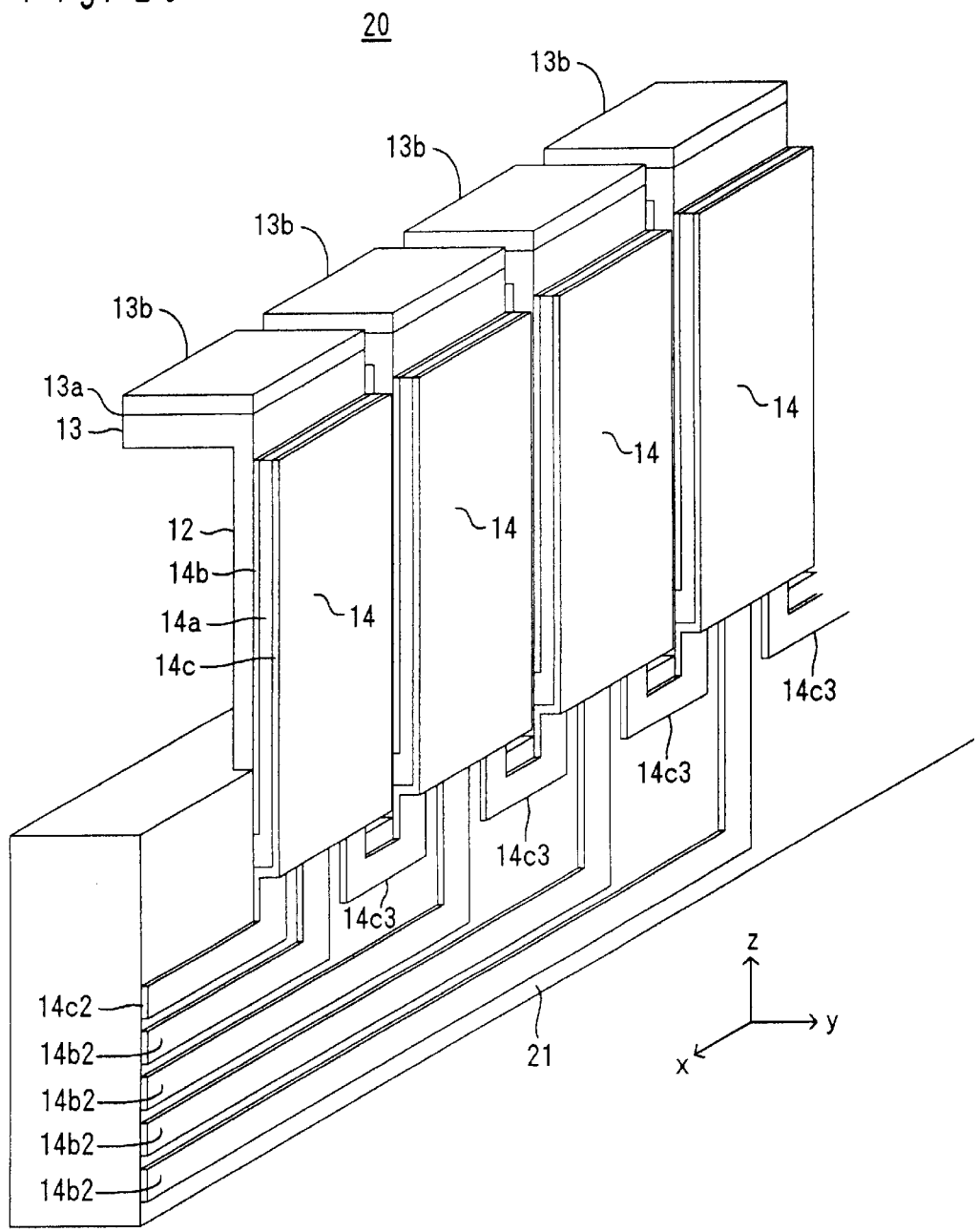
FIG. 26 is a perspective view of the piezoelectric/electrostrictive device of FIG. 4, showing a wiring example for the piezoelectric/electrostrictive device.

The piezoelectric/electrostrictive device 20 shown in FIG. 26 includes a plurality of first wiring conductors (first terminals T) 14b2 connected to the corresponding first electrodes 14b; a second wiring conductor 14c2 connected to the second electrode 14c of the leftmost piezoelectric/electrostrictive element 14 in FIG. 26; and a plurality of third wiring conductors 14c3 for connecting the second electrodes 14c of the adjacent piezoelectric/electrostrictive elements 14.

The first wiring conductors 14b2 are formed on the base portion 21 in the following manner. Each of the first wiring conductors 14b2 extends downward (in the negative direction of the z-axis) substantially from the center of the lower end of the corresponding first electrode 14b while extending through the corresponding piezoelectric/electrostrictive layer 14a and along the base portion 21, and is then bent perpendicularly to extend in the positive direction of the x-axis. The first wiring conductors 14b2 are connected, independently of one another, to an unillustrated drive circuit.

The second wiring conductor 14c2 is formed in the following manner. The second wiring conductor 14c2 extends in the negative direction of the x-axis to a position located under a lower left end portion of the leftmost piezoelectric/electrostrictive element 14 in FIG. 26 and is then bent perpendicularly to extend upward (in the positive direction of the z-axis). Subsequently, the second wiring conductor 14c2 extends in the positive direction of the y-axis along the lower end surface of the piezoelectric/electrostrictive layer 14a to thereby be connected to the second electrode 14c. The second wiring conductor 14c2 is connected to the above-mentioned drive circuit.

The third wiring conductors 14c3 are formed in the following manner. Each of the third wiring conductors 14c3 extends from a lower right end portion of the second electrode 14c of the corresponding piezoelectric/electrostrictive element 14 in the negative direction of the y-axis along the lower end surface of the piezoelectric/electrostrictive layer 14a to reach the base portion 21. Subsequently, the third wiring conductor 14c3 extends downward (in the negative direction of the z-axis) and is then bent perpendicularly. Then, the third wiring conductor 14c3 extends in the negative direction of the x-axis to a position located under a lower left end portion of the neighboring piezoelectric/electrostrictive element 14, and is then again bent perpendicularly to reach the lower left end portion of the piezoelectric/electrostrictive element 14. Subsequently, the third wiring conductor 14c3 extends in the positive direction of the y-axis along the lower end surface of the piezoelectric/electrostrictive layer 14a to thereby be connected to the second electrode 14c.

According to the above wiring configuration, while the second electrodes 14c are maintained at the same potential by means of the second wiring conductor 14c2 and the third wiring conductors 14c3, the above-mentioned drive circuit applies potential to the first electrodes 14b independently of one another via the corresponding first wiring conductors 14b2. Thus, the deformable portions 12 on which the corresponding piezoelectric/electrostrictive elements 14 are formed are displaced independently of one another. Accordingly, the active planes 13a of the corresponding reflective portions 13 (i.e., the reflective surfaces of the corresponding light-reflecting members 13b) can be changed in angle independently of one another.

Figure 27:
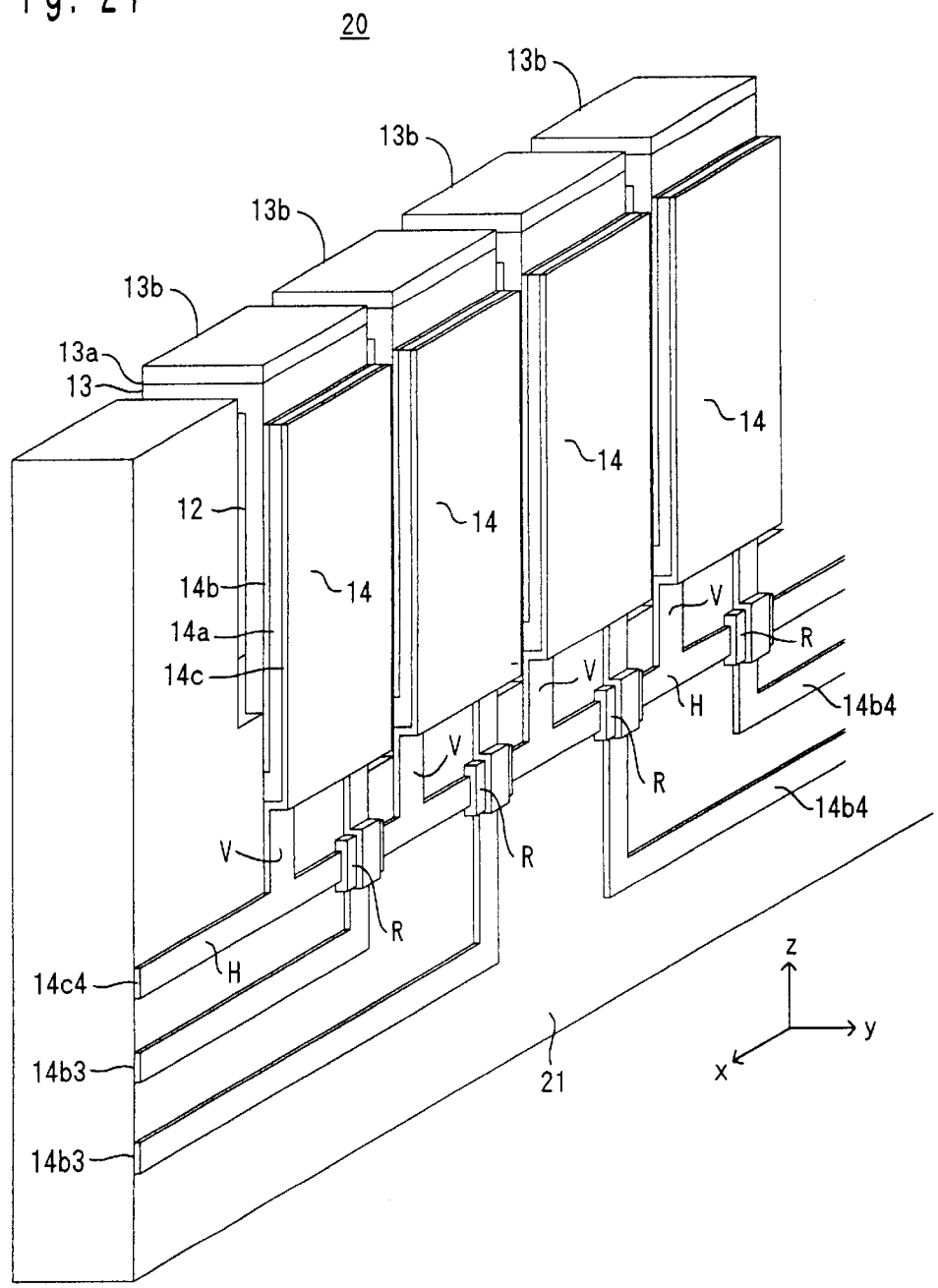
FIG. 27 is a perspective view of the piezoelectric/electrostrictive device of FIG. 4, showing a wiring example for the piezoelectric/electrostrictive device.

The piezoelectric/electrostrictive device 20 shown in FIG. 27 includes a plurality of first wiring conductors 14b3 and 14b4 for connecting the first electrodes 14b to an unillustrated drive circuit independently of one another and a second wiring conductor 14c4 for connecting the second electrodes 14c to the drive circuit in common.

The first wiring conductors 14b3 are formed in the following manner. Each of the first wiring conductors 14b3 is connected to the drive circuit and extends on the base portion 21 in the negative direction of the x-axis and reaches a position located under a lower right end portion of the corresponding piezoelectric/electrostrictive element 14. Then, the first wiring conductor 14b3 is bent upward (in the positive direction of the z-axis) and reaches the lower right end portion of the piezoelectric/electrostrictive element 14. Subsequently, the first wiring conductor 14b3 extends through the boundary between the piezoelectric/electrostrictive element 14 and the base portion 21 to thereby be connected to the corresponding first electrode 14b. Notably, at an intersection between the second wiring conductor 14c4 and a portion of the first wiring conductor 14b3 extending in the direction of the z-axis, an insulator R is provided to insulate the first and second wiring conductors 14b3 and 14c4 from each other.

Similarly, the first wiring conductors 14b4 are formed in the following manner. Each of the first wiring conductors 14b4 is connected to the drive circuit and extends on the base portion 21 in the positive direction of the x-axis and reaches a position located under a lower right end portion of the corresponding piezoelectric/electrostrictive element 14. Then, the first wiring conductor 14b4 is bent upward (in the positive direction of the z-axis) and reaches the lower right end portion of the piezoelectric/electrostrictive element 14. Subsequently, the first wiring conductor 14b4 extends through the boundary between the piezoelectric/electrostrictive element 14 and the base portion 21 to thereby be connected to the corresponding first electrode 14b. Notably, at an intersection between the second wiring conductor 14c4 and a portion of the first wiring conductor 14b4 extending in the direction of the z-axis, an insulator R is provided to insulate the first and second wiring conductors 14b4 and 14c4 from each other.

The second wiring conductor 14c4 includes a horizontal portion H and a plurality of vertical portions V. The horizontal portion H extends on the base portion 21 in the x-axis direction. Each of the vertical portions V extends upward (in the positive direction of the z-axis) from the horizontal portion H and reaches a lower left end portion of the corresponding piezoelectric/electrostrictive element 14. Subsequently, the vertical portion V extends on the lower end surface of the piezoelectric/electrostrictive layer 14a in the positive direction of the y-axis to thereby be connected to the corresponding second electrode 14c.

According to the above wiring configuration, while the second electrodes 14c are maintained at the same electric potential by means of the second wiring conductor 14c4, the above-mentioned drive circuit applies electric potential to the first electrodes 14b independently of one another via the corresponding first wiring conductors 14b3 and 14b4. Thus, the deformable portions 12 on which the corresponding piezoelectric/electrostrictive elements 14 are formed are displaced independently of one another. Accordingly, the active planes 13a of the corresponding reflective portions 13 (i.e., the reflective surfaces of the corresponding light-reflecting members 13b) can be changed in angle independently of one another.

Figure 28:
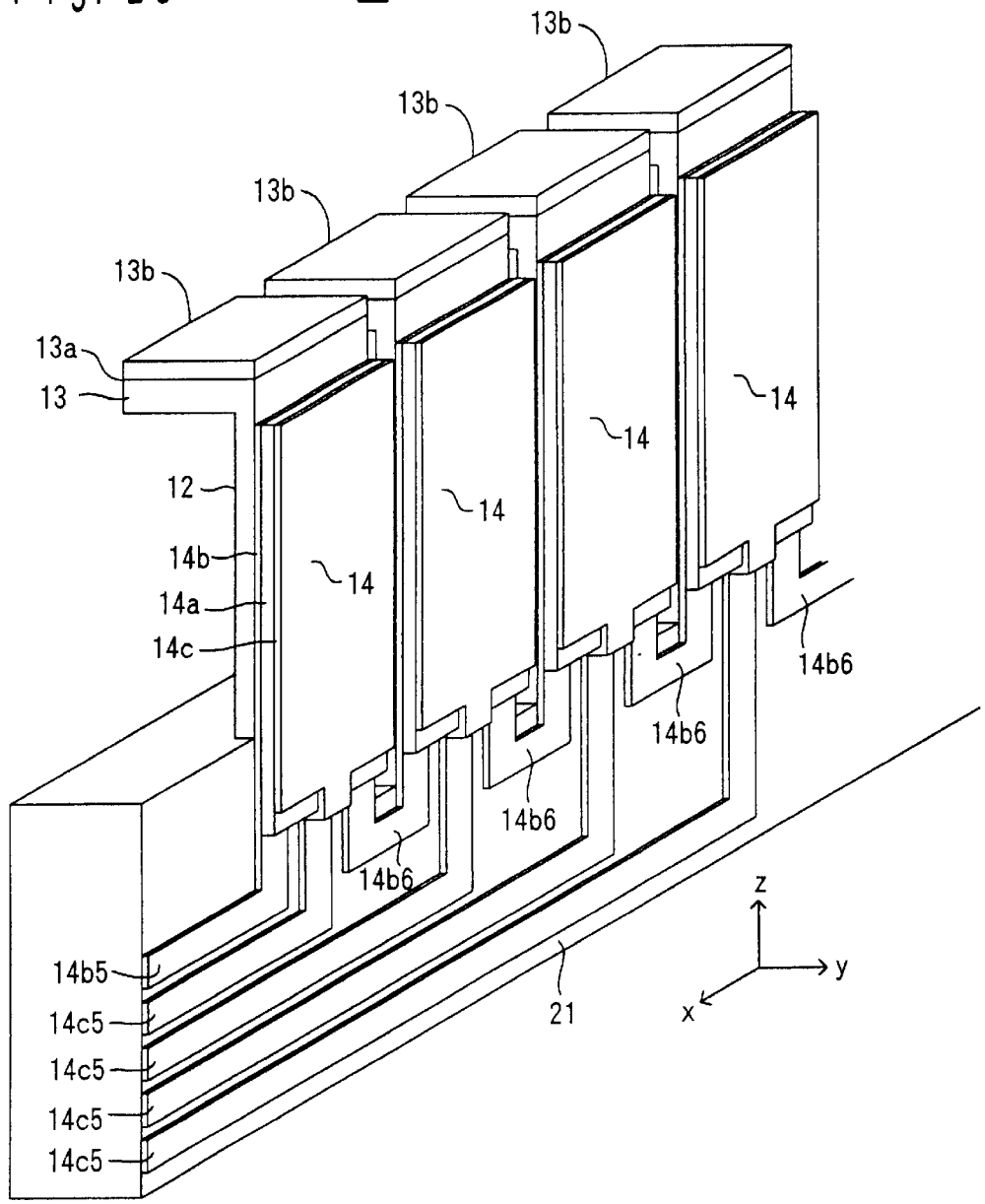
FIG. 28 is a perspective view of the piezoelectric/electrostrictive device of FIG. 4, showing a wiring example for the piezoelectric/electrostrictive device.

The piezoelectric/electrostrictive device 20 shown in FIG. 28 includes a first wiring conductor 14b5 connected to the first electrode 14b of the leftmost piezoelectric/electrostrictive element 14 in FIG. 28; a plurality of second wiring conductors 14b6 for connecting the first electrodes 14b of the adjacent piezoelectric/electrostrictive elements 14; and a plurality of third wiring conductors 14c5 for connecting the second electrodes 14c to an unillustrated drive circuit independently of one another.

The first wiring conductor 14b5 is formed in the following manner. The first wiring conductor 14b5 extends on the base portion 21 in the negative direction of the x-axis to a position located under a lower left end portion of the leftmost piezoelectric/electrostrictive element 14 in FIG. 28 and is then bent upward (in the positive direction of the z-axis) to thereby be connected to the first electrode 14b of the piezoelectric/electrostrictive element 14.

The second wiring conductors 14b6 are formed in the following manner. Each of the second wiring conductors 14b6 extends downward (in the negative direction of the z-axis) from a lower right end portion of the first electrode 14b of the corresponding piezoelectric/electrostrictive element 14 and is then bent perpendicularly. Then, the second wiring conductor 14b6 extends in the negative direction of the x-axis to a position located under a lower left end portion of the neighboring piezoelectric/electrostrictive element 14. Then, the second wiring conductor 14b6 is again bent perpendicularly to reach the lower left end portion of the piezoelectric/electrostrictive element 14. Furthermore, the second wiring conductor 14b6 extends upward (in the positive direction of the z-axis) to thereby be connected to the first electrode 14b of the neighboring piezoelectric/electrostrictive element 14.

The third wiring conductors 14c5 are formed in the following manner. Each of the third wiring conductors 14c5 extends in the negative direction of the z-axis substantially from the center of the lower end of the corresponding second electrode 14c and then extends in the negative direction of the y-axis to reach the base portion 21. Subsequently, the third wiring conductor 14c5 extends downward (in the negative direction of the z-axis) and is then bent perpendicularly. Then, the third wiring conductor 14c5 extends in the positive direction of the x-axis to thereby be connected to the drive circuit.

According to the above wiring configuration, while the first electrodes 14b are maintained at the same electric potential by means of the first wiring conductor 14b5 and 14b6, the above-mentioned drive circuit applies electric potential to the second electrodes 14c independently of one another via the corresponding second wiring conductors 14c5. Thus, the deformable portions 12 on which the corresponding piezoelectric/electrostrictive elements 14 are formed are displaced independently of one another. Accordingly, the active planes 13a of the corresponding reflective portions 13 (i.e., the reflective surfaces of the corresponding light-reflecting members 13b) can be changed in angle independently of one another.

Figure 29:
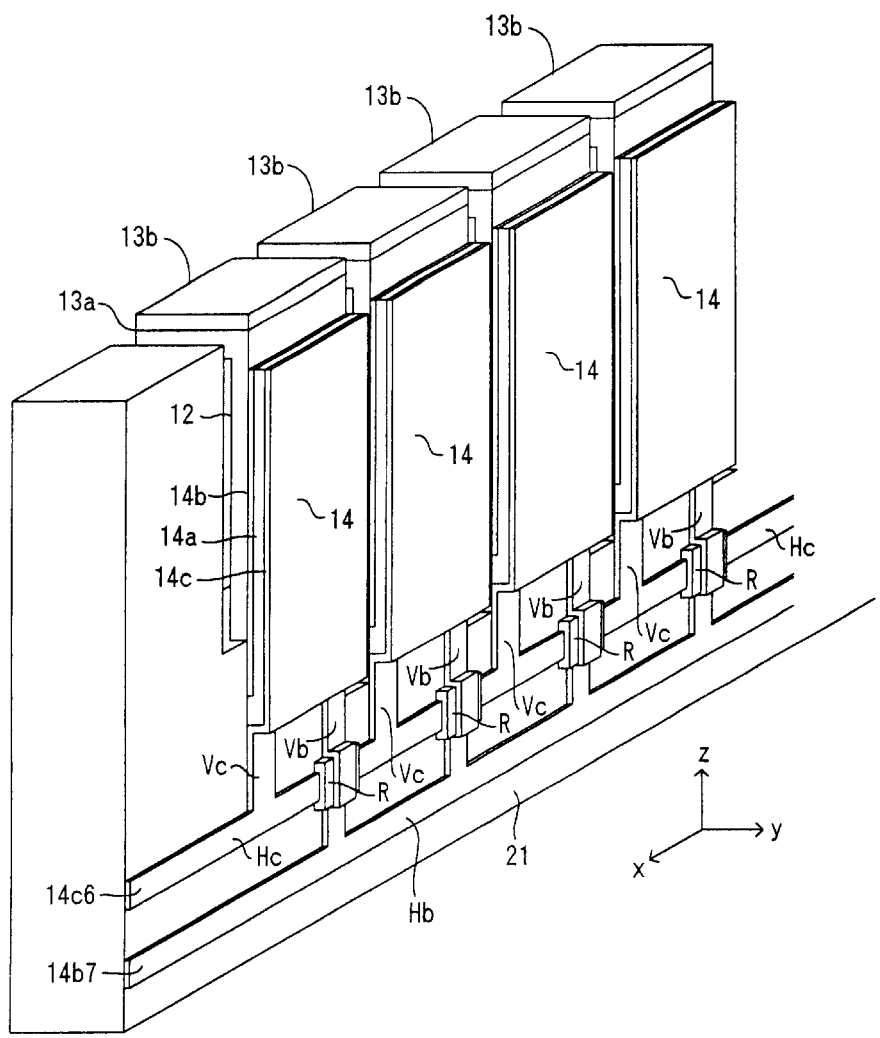
FIG. 29 is a perspective view of the piezoelectric/electrostrictive device of FIG. 4, showing a wiring example for the piezoelectric/electrostrictive device.

The piezoelectric/electrostrictive device 20 shown in FIG. 29 includes a first wiring conductor 14b7 for connecting the first electrodes 14b to an unillustrated drive circuit in common and a second wiring conductor 14c6 for connecting the second electrodes 14c to the drive circuit in common.

The first wiring conductor 14b7 includes a horizontal portion Hb and a plurality of vertical portions Vb. The horizontal portion Hb extends on the base portion 21 in the x-axis direction. Each of the vertical portions Vb extends upward (in the positive direction of the z-axis) from the horizontal portion Hb and reaches a lower right end portion of the corresponding piezoelectric/electrostrictive element 14. Subsequently, the vertical portion Vb extends through the boundary between the piezoelectric/electrostrictive element 14 and the base portion 21 to thereby be connected to the corresponding first electrode 14b.

The second wiring conductor 14c6 includes a horizontal portion Hc and a plurality of vertical portions Vc. The horizontal portion Hc extends on the base portion 21 in the x-axis direction. Each of the vertical portions Vc extends upward (in the positive direction of the z-axis) from the horizontal portion Hc and reaches a lower left end portion of the corresponding piezoelectric/electrostrictive element 14. Subsequently, the vertical portion Vc extends on the lower end surface of the piezoelectric/electrostrictive layer 14a in the positive direction of the y-axis to thereby be connected to the corresponding second electrode 14c. Notably, at an intersection between the horizontal portion Hc of the second wiring conductor 14c6 and each of the vertical portions Vb of the first wiring conductor 14b7, an insulator R is provided to insulate the first and second wiring conductors 14b7 and 14c6 from each other.

According to the above wiring configuration, the first electrodes 14b are connected to the drive circuit in common, while the second electrodes 14c are connected to the drive circuit in common. Thus, the same electric potential difference is always established between the first electrodes 14b and the corresponding second electrodes 14c. Thus, the deformable portions 12 on which the corresponding piezoelectric/electrostrictive elements 14 are formed are displaced simultaneously. Accordingly, the active planes 13a of the corresponding reflective portions 13 (i.e., the reflective surfaces of the corresponding light-reflecting members 13b) can be changed in angle simultaneously.

Figure 30:
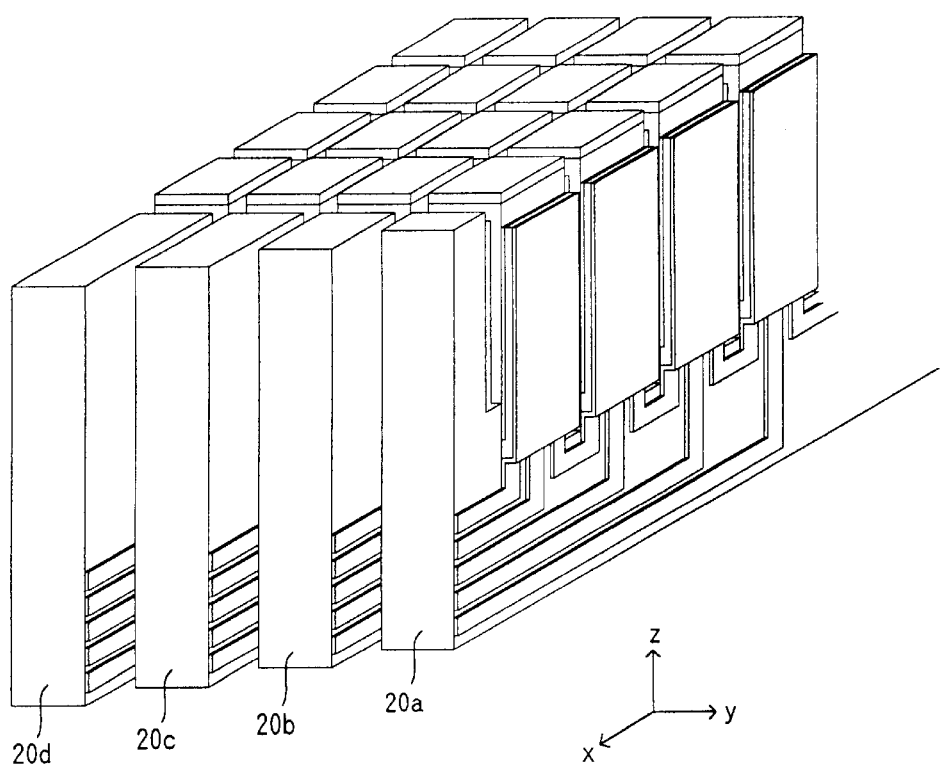
FIG. 30 is a perspective view of the piezoelectric/electrostrictive device of FIG. 5, showing a wiring example for the piezoelectric/electrostrictive device.

FIG. 30 shows an example of application of the wiring configuration of FIG. 26 to the piezoelectric/electrostrictive device 30 of the third embodiment. In FIG. 30, in order to facilitate connection of the wiring conductors to an unillustrated drive circuit, left end portions of constituent piezoelectric/electrostrictive devices 20a to 20d of the matrix are sequentially elongated in the x-axis direction such that the left end portion of a certain constituent piezoelectric/electrostrictive device projects beyond that of a neighboring constituent piezoelectric/electrostrictive device located on the positive-direction side along the y-axis.

Application Example

A specific example of application of the piezoelectric/electrostrictive device 30 of the third embodiment to an optical switch will next be described. The application to an optical switch described below is also applicable to other embodiments mentioned above.

Figure 31:
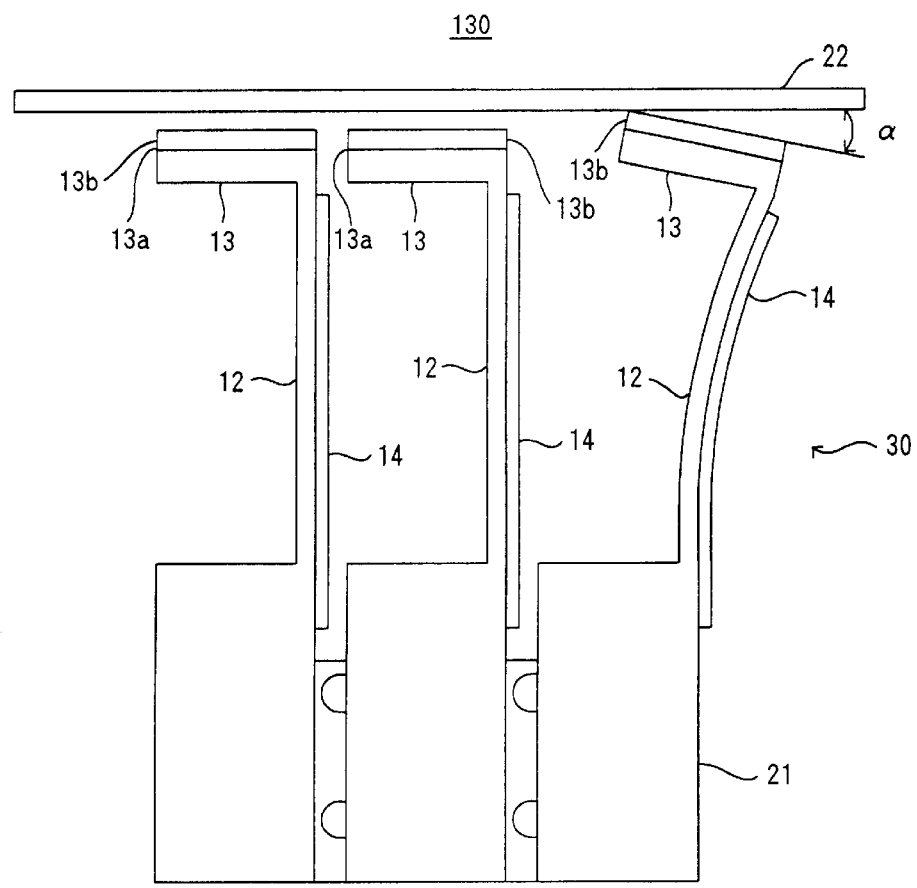
FIG. 31 is a front view of the piezoelectric/electrostrictive device of FIG. 5, showing an actual application example of the piezoelectric/electrostrictive device.

A piezoelectric/electrostrictive device 130 shown in FIG. 31 includes the piezoelectric/electrostrictive device 30 and a stopper member 22. The stopper member 22 is disposed above the light-reflecting members 13b of the piezoelectric/electrostrictive device 30 in such a manner as to be in parallel with the reflective surfaces of the light-reflecting members 13b when the deformable portions 12 are not displaced. The stopper member 22 is a transparent (light-transmitting) thin plate of, for example, glass, quartz, or transparent plastic (e.g., acrylic). The stopper member 22 is positioned such that, when the active plane 13a of a certain reflective portion 13 (accordingly, the reflective surface of the corresponding light-reflecting member 13b) is tilted by an angle α as a result of displacement of the corresponding deformable portion 12 effected through operation of the corresponding piezoelectric/electrostrictive element 14, an end portion of the light-reflecting member 13b abuts the stopper member 22, thereby preventing the reflective surface from tilting further in excess of the angle α.

The angle α is smaller than the maximum tilting angle θm of the reflective surface of the light-reflecting member 13b which is obtained as a result of operation of the piezoelectric/electrostrictive element 14. When a predetermined electric potential difference is established between the first and second electrodes (not shown in FIG. 31) of the piezoelectric/electrostrictive element 14 so as to tilt the reflective surface of the light-reflecting member 13b in excess of a tilting angle of α, an end portion of the light-reflecting member 13b abuts the stopper member 22 to thereby hold the tilting angle of the reflective surface at the angle α. Thus, the reflective surface, when tilted, can always be held at the constant angle α.

Through employment of the stopper member 22, the reflection angle (tilting angle) of the reflective surface associated with operation of the piezoelectric/electrostrictive element 14 can be stabilized over a long period of time. Also, the reflection angle is held uniform among reflective surfaces within a single piezoelectric/electrostrictive device and among a plurality of piezoelectric/electrostrictive devices.

Figure 32:
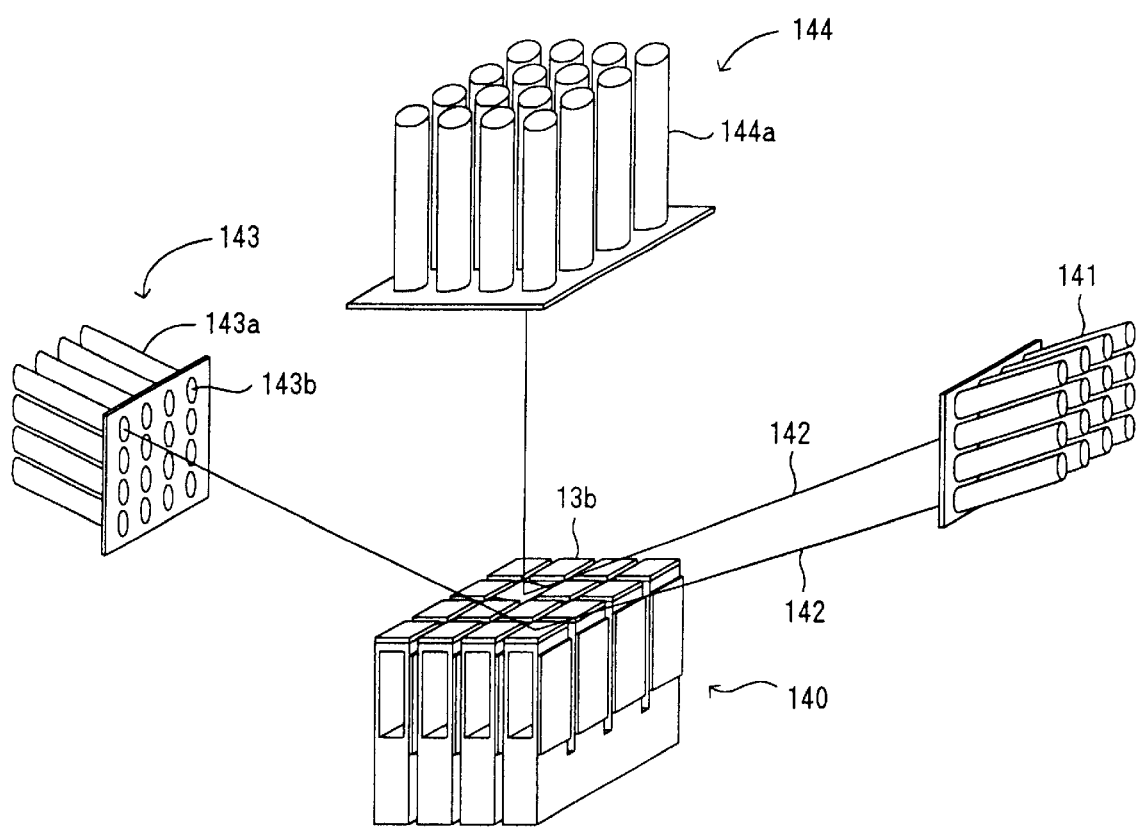
FIG. 32 is a conceptual view of the piezoelectric/electrostrictive devices of FIG. 12 arranged in a matrix and adjacent to one another for use as an optical switch.
Figure 33:
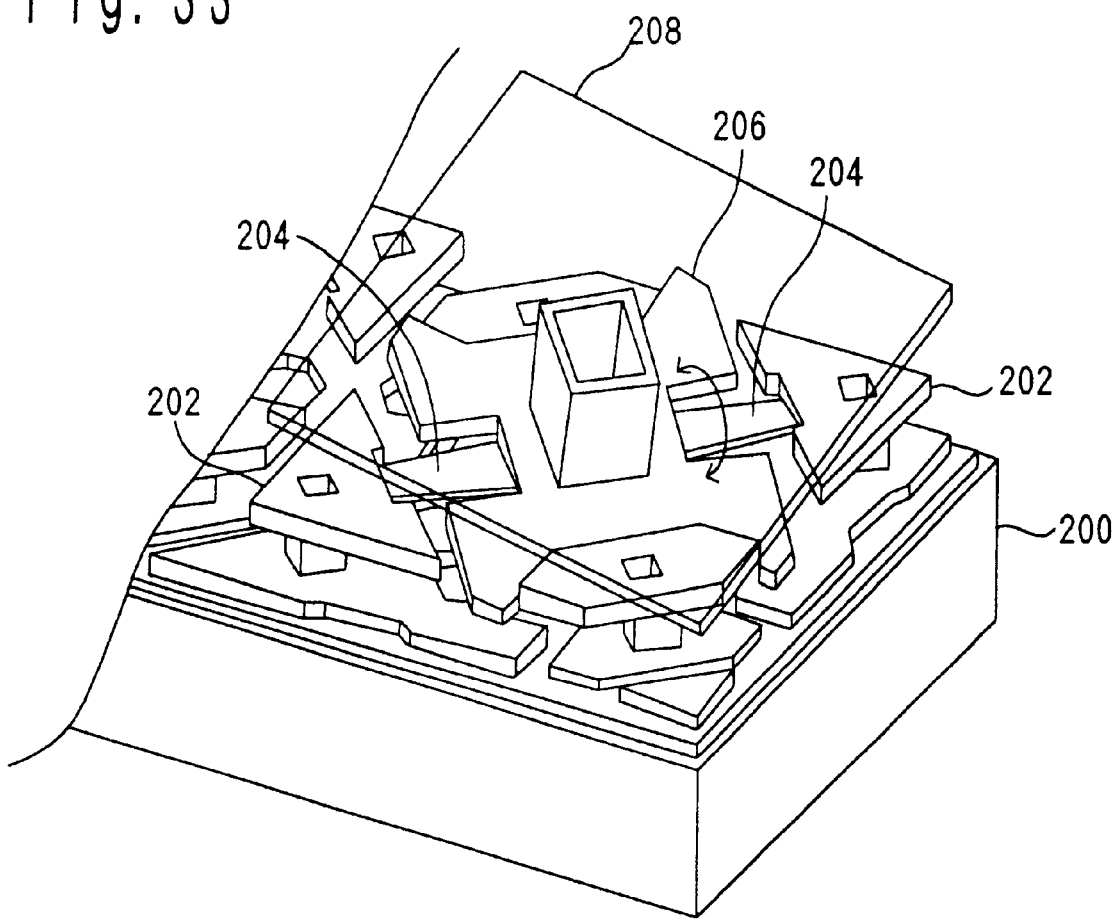
FIG. 33 is a perspective view of a conventional deformable mirror device (DMD)
Figure 34:
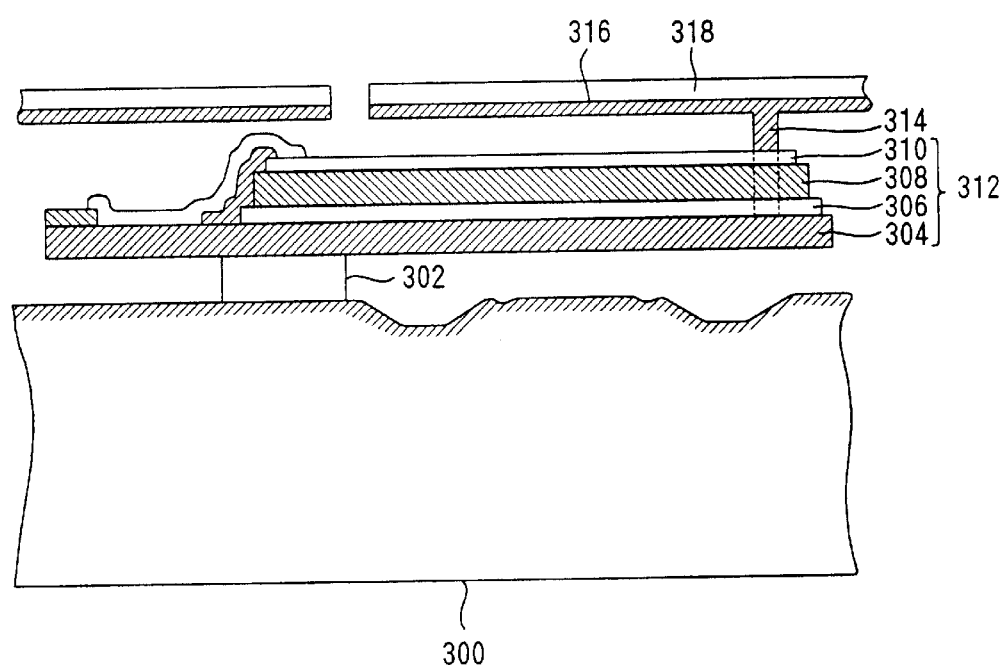
FIG. 34 is a schematic sectional view of a conventional thin film actuated mirror array (AMA).

FIG. 32 exemplifies application of a piezoelectric/electrostrictive device 140 (or the piezoelectric/electrostrictive device 100 shown in FIG. 16) to an optical switch. The piezoelectric/electrostrictive device 140 is composed of a plurality of piezoelectric/electrostrictive devices 50 shown in FIG. 12, which are arranged in a matrix and adjacent to one another. The optical switch of FIG. 32 includes a plurality of optical fibers 141 for transmission of light. Light transmitted through an optical fiber 141 is reflected by a light-reflecting member 13b located on an optical axis 142 of the optical fiber 141. When the reflective surface of the light-reflecting member 13b to which light is incident is not tilted, incident light is reflected by the light-reflecting member 13b and then enters, through a lens 143b, a corresponding optical fiber 143a in a first output optical-fiber group 143. When the reflective surface of the light-reflecting member 13b to which light is incident is tilted, incident light is reflected by the light-reflecting member 13b and then enters, through a lens, a corresponding optical fiber 144a in a second output optical-fiber group 144. In this manner, channels of an optical signal are changed over.

As described above, the above embodiments of the present invention each provide a piezoelectric/electrostrictive device of small size having a light modulation mechanism capable of stably maintaining flatness of a light-reflecting surface over a long period of time and capable of providing excellent durability and reliability.

The present invention is not limited to the above embodiments, but may be modified in various forms without departing from the scope of the invention. For example, the above embodiments are described while mentioning a unitary body of ceramics including the base portion 11 (21), the deformable portion 12, and the reflective portion 13 or a unitary body of ceramics including the base portion 11 (21), the deformable portion 12, the reflective portion 13, and the holder portion 51; however, these portions may assume the form of members of metal or the form of members of ceramics and metal. In the case where the base portion 11 (21) is entirely formed of metal, the base portion 11 (21) can be formed through casting or through cladding on a metal laminate. The angle of intersection of the deformable plane 12a of the deformable portion 12 and the active plane 13a of the reflective portion 13 (or the reflective surface of the light-reflecting member 13b) is not particularly limited so long as the planes 12a and the 13a intersect with each other.

According to the above embodiments in which a plurality of piezoelectric/electrostrictive devices; i.e., a plurality of (one set of) functional elements, are disposed in a matrix and adjacent to one another, rows and columns in the matrix intersect at right angles and are arranged at the respectively regular intervals. However, rows and columns in the matrix may be arranged at irregular intervals. Furthermore, according to the above embodiments in which the functional elements are disposed in a matrix and adjacent to one another, the reflective surfaces of the light-reflecting members 13b are present within the same x-y plane. However, the present invention is not limited thereto. For example, while reflective surfaces are present within the same plane (i.e., the reflective surfaces are at the same height above the bottom surface of the base portion 21) in each column (in the x-axis direction), the height of a column of reflective surfaces may be changed stepwise in the row direction (in the y-axis direction) such that the central column of reflective surfaces is the lowest (the height of a column of reflective surfaces above the bottom surface of the base portion 21 increases stepwise from the central column of reflective surfaces in opposite directions of the y-axis).

What is claimed is:

1. A piezoelectric/electrostrictive device comprising a functional element which comprises:

a base portion;

a deformable thin plate portion extending from said base portion to thereby form a plane;

a piezoelectric/electrostrictive element tightly fixed to at least said deformable portion; and a reflective portion extending from said deformable portion so as to form an active plane intersecting with the plane of said deformable portion, and having a light-reflecting member disposed on the active plane, wherein upon operation of said piezoelectric/electrostrictive element, said deformable portion deforms in a direction substantially perpendicular to the plane of said deformable portion to thereby change a reflection angle of light reflected from said reflective portion.

2. A piezoelectric/electrostrictive device according to claim 1, wherein said reflective portion extends from an end part of said deformable portion while having a width substantially equal to that of said deformable portion.

3. A piezoelectric/electrostrictive device according to claim 1, comprising a plurality of said functional elements, wherein said plurality of functional elements are arranged linearly adjacent to one another.

4. A piezoelectric/electrostrictive device according to claim 3, wherein said plurality of functional elements have respective base portions formed into a common base portion.

5. A piezoelectric/electrostrictive device according to claim 1, comprising a plurality of said functional elements, wherein said plurality of functional elements are arranged in a matrix and adjacent to one another.

6. A piezoelectric/electrostrictive device according to claim 5, wherein at least a column of said functional elements in the matrix has respective base portions formed into a common base portion.

7. A piezoelectric/electrostrictive device according to claim 1, wherein said base portion, said deformable portion, and said reflective portion of said functional element are formed of a unitary body of ceramics.

8. A piezoelectric/electrostrictive device according to claim 7, wherein said piezoelectric/electrostrictive element is a film-type piezoelectric/electrostrictive element and is integrated with said deformable portion through firing.

9. A piezoelectric/electrostrictive device comprising a functional element which comprises:

a base portion;

a deformable thin plate portion extending from said base portion to thereby form a plane;

a piezoelectric/electrostrictive element tightly fixed to at least said deformable portion;

a reflective portion extending from said deformable portion so as to form an active plane intersecting with the plane of said deformable portion, and having a light-reflecting member disposed on the active plane; and a holder portion extending from said base portion in opposition to said deformable portion to thereby hold a part of said reflective portion, wherein upon operation of said piezoelectric/electrostrictive element, said deformable portion deforms in a direction substantially perpendicular to the plane of said deformable portion to thereby change a reflection angle of light reflected from said reflective portion without deformation of said holder portion.

10. A piezoelectric/electrostrictive device according to claim 9, wherein said reflective portion extends from an end part of said deformable portion while having a width substantially equal to that of said deformable portion.

11. A piezoelectric/electrostrictive device according to claim 9, comprising a plurality of said functional elements, wherein said plurality of functional elements are arranged linearly adjacent to one another.

12. A piezoelectric/electrostrictive device according to claim 11, wherein said plurality of functional elements have respective base portions formed into a common base portion.

13. A piezoelectric/electrostrictive device according to claim 9, comprising a plurality of said functional elements, wherein said plurality of functional elements are arranged in a matrix and adjacent to one another.

14. A piezoelectric/electrostrictive device according to claim 13, wherein at least a column of said functional elements in the matrix has respective base portions formed into a common base portion.

15. A piezoelectric/electrostrictive device according to claim 9, wherein said base portion, said deformable portion, said reflective portion, and said holder portion of said functional element are formed of a unitary body of ceramic.

16. A piezoelectric/electrostrictive device according to claim 15, wherein said piezoelectric/electrostrictive element is a film-type piezoelectric/electrostrictive element and is integrated with said deformable portion through firing.

* * * * *